(12) United States Patent
Takeuchi et al.

(10) Patent No.: US 7,809,040 B2
(45) Date of Patent: Oct. 5, 2010

(54) RED SURFACE EMITTING LASER ELEMENT, IMAGE FORMING DEVICE, AND IMAGE DISPLAY APPARATUS

(75) Inventors: Tetsuya Takeuchi, Yokohama (JP); Mamoru Uchida, Yokohama (JP); Tomoyuki Miyamoto, Yokohama (JP); Fumio Koyama, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 12/028,562

(22) Filed: Feb. 8, 2008

(65) Prior Publication Data

US 2008/0212631 A1 Sep. 4, 2008

(30) Foreign Application Priority Data

Feb. 14, 2007 (JP) ............... 2007-033788
Feb. 4, 2008 (JP) ............... 2008-024485

(51) Int. Cl.
*H01S 5/00* (2006.01)

(52) U.S. Cl. ............. 372/50.11; 372/43.01; 372/50.124

(58) Field of Classification Search ............. 372/43.01, 372/50.11, 50.124
See application file for complete search history.

(56) References Cited

U.S. PATENT DOCUMENTS

| | | | | |
|---|---|---|---|---|
| 5,258,990 | A | | 11/1993 | Olbright et al. |
| 5,351,256 | A | * | 9/1994 | Schneider et al. ...... 372/45.011 |
| 5,513,202 | A | * | 4/1996 | Kobayashi et al. ............. 372/96 |
| 5,699,373 | A | | 12/1997 | Uchida et al. ................. 372/27 |
| 5,963,568 | A | * | 10/1999 | Paoli ............................ 372/23 |
| 6,546,038 | B1 | * | 4/2003 | Mizuno ........................ 372/96 |
| 6,795,478 | B2 | * | 9/2004 | Hwang et al. ................. 372/96 |
| 6,833,939 | B1 | * | 12/2004 | Ichikawa ................. 359/204.1 |
| 6,977,820 | B2 | | 12/2005 | Uchida ........................ 361/761 |
| 2002/0061043 | A1 | | 5/2002 | Tanaka |
| 2004/0213312 | A1 | | 10/2004 | Tan et al. |
| 2004/0233954 | A1 | | 11/2004 | Hayakawa |
| 2005/0100068 | A1 | | 5/2005 | Jikutani et al. |
| 2006/0056756 | A1 | | 3/2006 | Uchida ........................ 385/14 |
| 2006/0216200 | A1 | | 9/2006 | Nagatomo et al. ......... 422/68.1 |

(Continued)

FOREIGN PATENT DOCUMENTS

JP 7-288362 10/1995

(Continued)

OTHER PUBLICATIONS

Tansu et al, "Low-Temperature Sensitive, Compressively Strained InGaAsP Active ($\lambda$=0.78-0.85 $\mu$m) Region Diode Lasers", Jun. 2000, IEEE, Photonics Technology Letters vol. 12, No. 6, 603-605.*

(Continued)

*Primary Examiner*—Minsun Harvey
*Assistant Examiner*—Joshua King
(74) *Attorney, Agent, or Firm*—Fitzpatrick, Cella, Harper & Scinto

(57) ABSTRACT

A red surface emitting laser element includes a first reflector, a second reflector including a p-type semiconductor multi-layer film, an active layer between the first reflector and the second reflector, and a p-type semiconductor spacer layer between the active layer and the second reflector, the p-type semiconductor spacer layer having a thickness of 100 nm or more and 350 nm or less.

12 Claims, 12 Drawing Sheets

U.S. PATENT DOCUMENTS

| | | | |
|---|---|---|---|
| 2006/0245459 A1* | 11/2006 | Onishi et al. | 372/46.01 |
| 2007/0223546 A1* | 9/2007 | Brenner et al. | 372/43.01 |
| 2008/0212636 A1* | 9/2008 | Sato et al. | 372/50.11 |

FOREIGN PATENT DOCUMENTS

| | | |
|---|---|---|
| JP | 10-65277 A | 3/1998 |
| JP | 2000-299493 A | 10/2000 |
| JP | 2002-158406 A | 5/2002 |

OTHER PUBLICATIONS

Crawford, M.H., et al., "Temperature-Dependent Characteristics and Single-Mode Performance of AlGaInP-Based 670-690-nm Vertical-Cavity Surface-Emitting Lasers," IEEE Photonics Technology Letters, vol. 7, No. 7 (Jul. 1995), 724-726.

Schneider, R.P., "Efficient Room-Temperature Continuous-Wave AlGaInP/AlGaAs Visible (670 nm) Vertical-Cavity Surface-Emitting Laser Diodes," IEEE Photonics Technology Letter, vol. 6, No. 3 (Mar. 1994), 313-316.

Japanese Office Action in corresponding Japanese Patent Application No. 2008-024485.

Peter S. Zory, Jr., Quantum Well Lasers, 1993, pp. 422-425.

H. C. Casey, Jr. et al., Heterostructure Lasers—Quantum Electronics—Principles and Applications, 1978, pp. 174 and 175.

R. P. Schneider, Jr., et al., InAlP/InAlGaP distributed Bragg reflectors for visible vertical cavity surface-emitting lasers, Applied Physics Letters, American Institute of Physics, May 31, 1993, pp. 2478 to 2750, New York, USA.

European Search Report dated Sep. 8, 2009 in corresponding European Application No. 08002642.0.

Office Action dated Jun. 4, 2010 from corresponding Chinese Patent Application No. 200910164918.9.

* cited by examiner

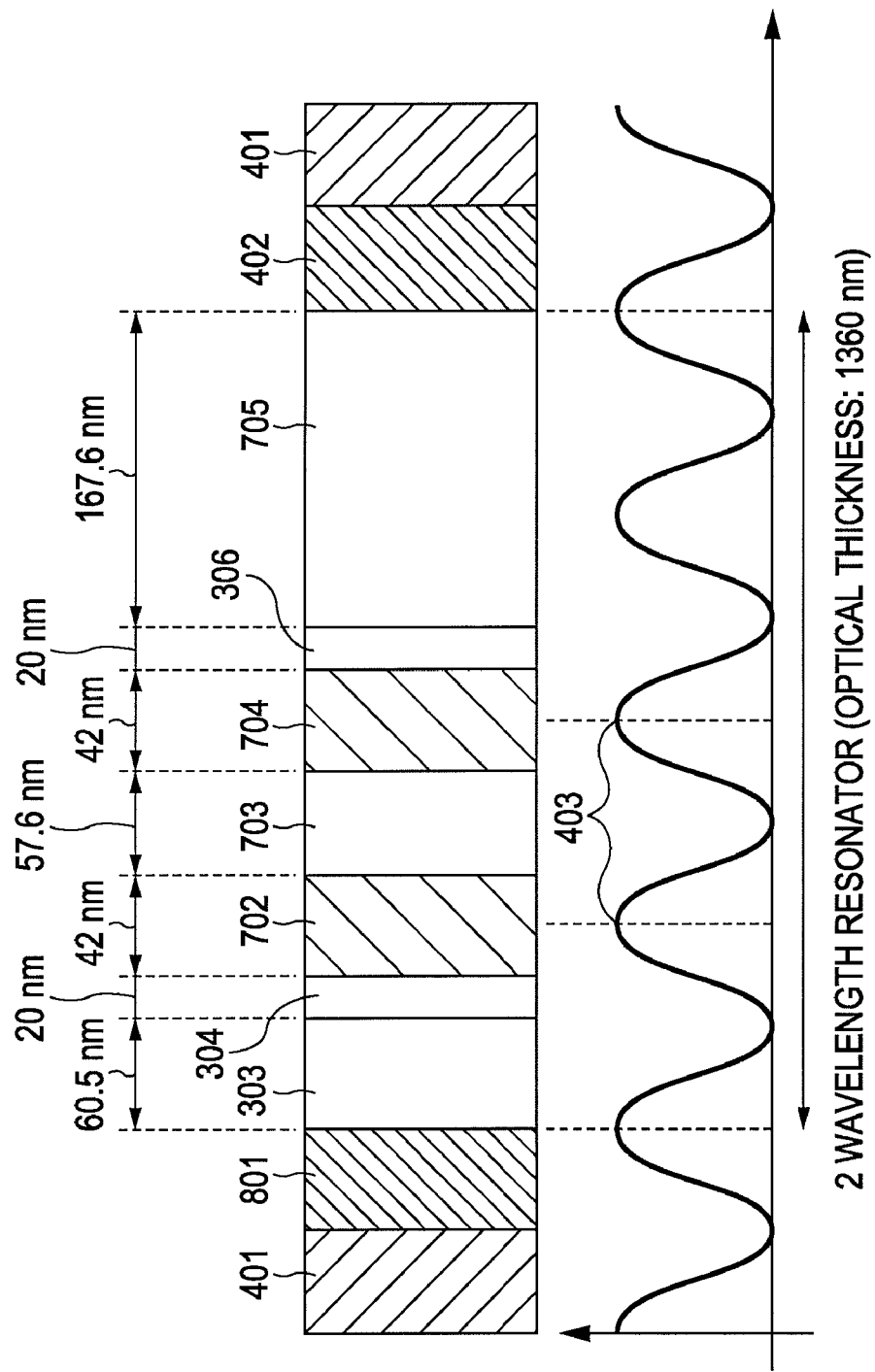

RED SURFACE EMITTING LASER ELEMENT, IMAGE FORMING DEVICE, AND IMAGE DISPLAY APPARATUS

BACKGROUND OF THE INVENTION

1. Field of the Invention

The present invention relates to a red surface emitting laser element and an image forming device and an image display apparatus incorporating the red surface emitting laser element.

2. Description of the Related Art

A. Usefulness of Red Surface Emitting Laser Element

A surface emitting laser element (in particular, a surface emitting laser of a vertical cavity type is called a vertical cavity surface emitting laser (VCSEL)) can output light in a direction perpendicular to the surface direction of the semiconductor substrate and can relatively easily be formed as a two dimensional array.

When the element is formed as a two dimensional array, parallel processing is realized by multiple beams emitted therefrom. Thus, application of this two dimensional array technology to various industrial usages is desired to achieve a higher density and a higher speed.

For example, the surface emitting laser array may be used as an exposure light source of an electrophotographic printer so that the printing rate can be increased by parallel processing of the printing step using multiple beams.

A surface emitting laser currently put into practice is an element that outputs a laser beam in the infrared region (wavelength $\lambda=0.75$ μm to 1 μm). If the oscillation wavelength is further shortened, the beam diameter can be further reduced and an image with a higher resolution can be obtained.

A red surface emitting laser element outputs light having a wavelength (about 0.6 μm to about 0.73 μm) shorter than that in the infrared region. Moreover, at this wavelength, the sensitivity of amorphous silicon applicable to a photosensitive drum of an electrophotographic printer is very high.

Thus, red surface emitting lasers are now desired to be put into practical for use in photosensitive drums composed of amorphous silicon to achieve higher speed, higher resolution image printing.

The effect brought about by the combination of an increase in resolution by shorter wavelength and multi-beam parallel processing is significantly large. This combination is expected to make contributions in various fields including electrophotographic printers and image display apparatuses such as laser displays.

B. Basic Structure of Red Surface Emitting Laser

In order to generate light having a wavelength in the red region, a semiconductor material, AlGaInP is typically used. The lattice of this material matches with the lattice of GaAs, which is the material constituting the deposition substrate, and the bandgap energy can be controlled by varying the compositional ratios of aluminum and gallium.

In order to generate laser oscillation, a threshold current or higher must be injected to the laser element. Current injection allows carriers, such as electrons or holes, to be injected to the active layer, and the carriers are eventually converted to light as they undergo radiative recombination.

C. Specific Examples of Related Art

A red surface emitting laser is formed by interposing a resonator region including an AlGaInP active layer between multilayered reflectors composed of a different semiconductor material, AlGaAs. A GaAs substrate whose lattice matches with those of the active layer and the multilayered reflectors is used as the substrate.

In 1995, a group led by Crawford of Sandia National Laboratories disclosed the element structure of a 1-wavelength resonator structure (see M. H. Crawford et al., IEEE PHOTONICS TECHNOLOGY LETTERS, Vol. 7, No. 7 (1995), 724, hereinafter referred to as "Crawford reference").

This one wave resonator structure has the most widely used cavity length in surface emitting lasers that output infrared emission. In red surface emitting lasers, the 1 wavelength cavity length is about 200 nm (in the case where the wavelength is 680 nm) in terms of layer thickness.

In particular, an active layer having a multiquantum well structure 40 nm to 50 nm in thickness is disposed in the central region of the 1-wavelength cavity length. A p-type AlGaInP layer and an n-type AlGaInP layer which each function as a spacer layer and have a thickness of 80 nm or less are disposed on both sides of the active layer.

In some cases, an undoped spacer layer is disposed between the active layer and the doped p-type (or n-type) spacer layer. In such cases, the thickness of the p-type (or n-type) AlGaInP spacer layer is about 50 nm.

In Crawford reference, the thickness of the p-type or n-type AlGaInP layer is about 50 nm.

Crawford reference also teaches that the maximum light output power at a 675 nm mode is 2.8 mW (20° C.) from the element with 15 μm ϕ oxide aperture.

SUMMARY OF THE INVENTION

In using a red surface emitting laser element as an electrophotographic light source, high performance characteristics at high temperature are required.

However, Crawford reference discloses that according to its element structure, the maximum light output power decreases significantly if the ambient temperature rises from 20° C. to 40° C. In particular, in a 675 nm mode, the maximum light output power decreases to about 1.0 mW (an output decrease down to less than 40%).

The present inventors have found that when the amount of current injected is increased to enhance the output operation, the temperature inside the element increases to 20° C. or more with the increasing current injection although the ambient temperature is 20° C. In such cases, the light output power does not increase but may decrease with the increase in amount of current injection. Thus, the maximum light output power is limited.

It is presumed that such a decrease in light output power occurs because the leakage current, which does not contribute to emission, increases significantly with temperature elevation.

A novel red surface emitting laser element that can decrease the amount of leakage current and an image forming device or image display apparatus incorporating such a red surface emitting laser element are desired.

A first aspect of the present invention provides a red surface emitting laser element that includes a first reflector, a second reflector including a p-type semiconductor multilayer film, an active layer between the first reflector and the second reflector, and a p-type semiconductor spacer layer between the active layer and the second reflector, wherein the p-type semiconductor spacer layer has a thickness of 100 nm or more and 350 nm or less.

A second aspect of the present invention provides a red surface emitting laser element that includes a first reflector, a second reflector including a p-type AlGaAs semiconductor multilayer film, an active layer between the first reflector and the second reflector, and a p-type AlInP semiconductor spacer layer or a p-type AlGaInP semiconductor spacer layer having a thickness of 100 nm or more and 350 nm or less between the active layer and the second reflector.

A third aspect of the present invention provides a red surface emitting laser element that includes a first reflector, a second reflector including a p-type semiconductor multilayer film, an active layer between the first reflector and the second reflector, and a p-type semiconductor spacer layer between the active layer and the second reflector. In the red surface emitting laser element, the conduction band edge at X point of the p-type semiconductor multilayer film is lower than the conduction band edge at X point of the p-type semiconductor spacer layer, and the thickness of the p-type semiconductor spacer layer is 100 nm or more and 350 nm or less.

An image forming device and an image display apparatus are also provided. Each includes any one of the red surface emitting laser elements described above and a deflector for deflecting the laser beam output from the laser element to conduct scanning.

A novel red surface emitting laser element in which the leakage current is reduced and an image forming device and an image display apparatus including the red surface emitting laser element are provided.

Further features of the present invention will become apparent from the following description of exemplary embodiments with reference to the attached drawings.

BRIEF DESCRIPTION OF THE DRAWINGS

FIG. 10 is a schematic cross-sectional view showing a resonator structure of Example 4.

DESCRIPTION OF THE EMBODIMENTS

As described above, a red surface emitting laser element having a structure described in Crawford reference undergoes significant degradation in performance characteristics at high temperature.

The present inventors have assumed that the causes thereof are the rapid increase in amount of leakage current due to heat and a drastic drop in luminous efficiency resulting from such a rapid increase in amount of leakage current.

Figure 6:
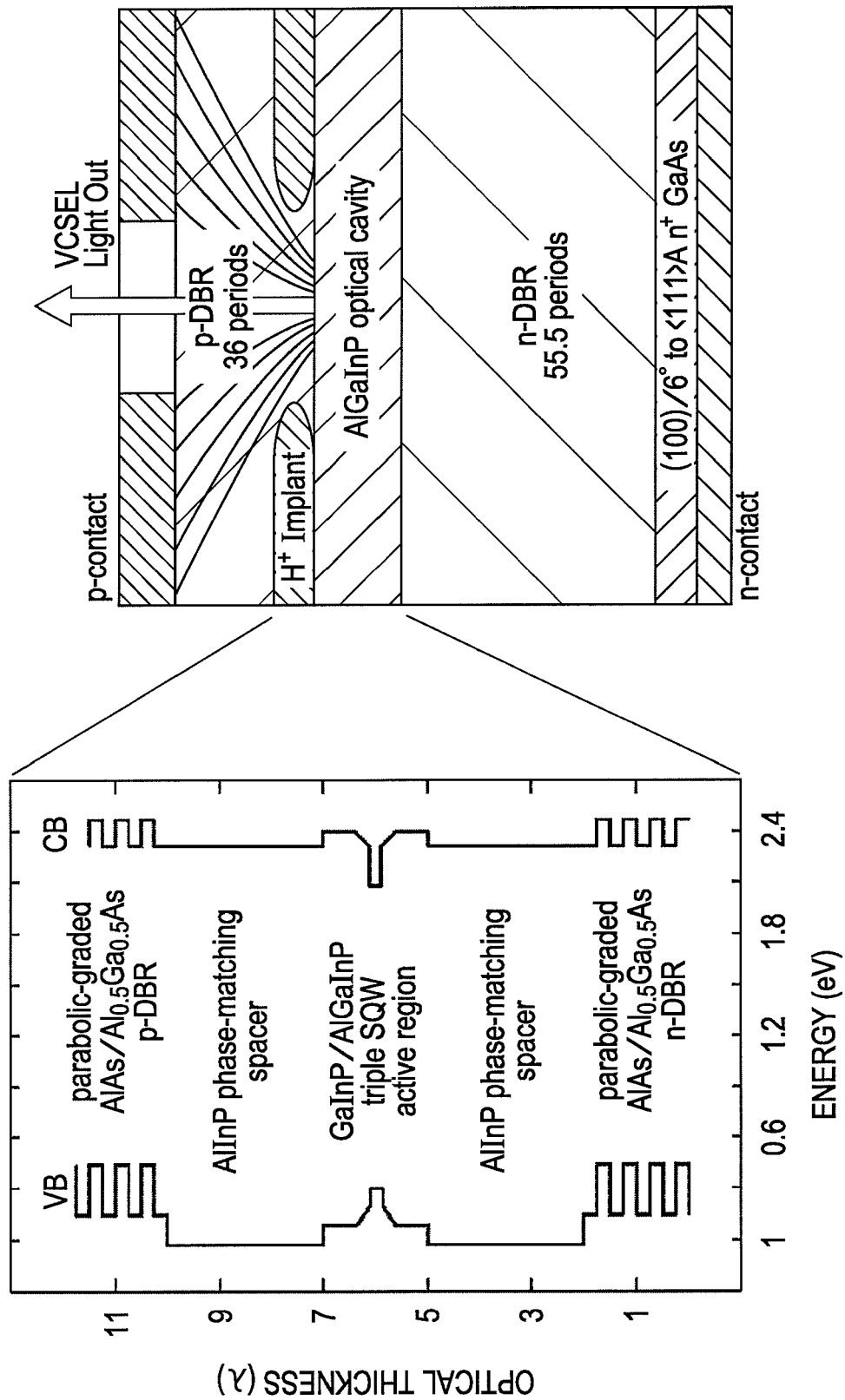
FIG. 6 is a band diagram cited from Schneider reference.

FIG. 6 is the band diagram described in R. P. Schneider et al., IEEE PHOTONICS TECHNOLOGY LETTERS, Vol. 6, No. 3 (1994) 313 (hereinafter referred to as "Schneider reference") related to the red VCSEL as with the Crawford reference.

In particular, FIG. 6 shows a band diagram of an active layer, AlInP spacer layers (the spacer layers are sometimes referred to as cladding layers), and distributed Bragg reflector (DBR) regions constituted by semiconductor multilayer films that function as reflectors (AlAs/Al$_{0.5}$Ga$_{0.5}$As multilayer films). DBRs are used as reflectors of a resonator.

FIG. 6 shows that the conduction band edges (the CB side in FIG. 6) of the constituent elements of the DBR regions are higher than the band edges of AlInP constituting the spacer layers.

In other words, this diagram shows that the electrons that overflowed the hetero barrier between the active layer and the AlInP spacer layer rarely diffuse over the thickness of the AlInP layer.

On the other hand, the element structure disclosed in the Crawford reference includes an active layer, a p-type Al$_{0.25}$Ga$_{0.25}$In$_{0.5}$P spacer layer adjacent to the active layer, and a multilayer film reflector including 34 pairs of layers, each pair including a p-type AlAs layer about 50 nm in thickness and a p-type Al$_{0.5}$Ga$_{0.5}$As layer about 50 nm in thickness.

In this case, the thickness of the p-type layer, which is the total thickness of the p-type AlInP spacer layer and the p-type DBR layer, is 3 μm or more.

As described above, in the cases where the p-type DBR region having a conduction band edge higher than that of the p-type spacer layer is sufficiently thick, the possibility that the electrons injected from the n-type semiconductor layer to the active layer will overflow to the p-type spacer layer adjacent to the active layer so as to cause leakage current can be dramatically small.

This means that, in the spacer layer, the concentration gradient of electrons that overflowed from active layers is more gradual than in the case where no p-type DBR region is provided.

The magnitude of the diffusion current related to leakage is dependent on the electron concentration gradient. Thus, the band diagram shown in FIG. 6 shows that the amount of diffusion current component of the leakage current generated by the electrons crossing over the spacer layer should be significantly small.

However, as described above, a red surface emitting laser element has poor temperature characteristics.

In a red surface emitting laser element, the resonator region interposed between the upper and lower multilayer film reflectors is usually composed of AlGaInP, while the multilayer film reflectors are usually composed of AlGaAs. In other words, the resonator region is composed of a material different from that of the multilayer film reflector regions.

In the red surface emitting laser element, both a p-type semiconductor space layer (e.g., a p-type AlGaInP spacer layer) and a p-type DBR region (e.g., an AlGaAs layer) are provided as the p-type layer. This unique structure is not found in infrared surface emitting lasers in which all layers are composed of AlGaAs-based materials.

In other words, in order to analyze the influence on the leakage current in a device including a multilayer structure composed of different materials of the same conductivity type, it is necessary to analyze in detail the location of the conduction band edge, which is the potential that affects electrons.

Thus, the potential of electrons is investigated by simultaneously taking into account the following two factors with respect to the p-type spacer layer and the constituent layers of the p-type DBR region of the red surface emitting laser element:

(1) Since these p-type layers are doped with a p-type impurity, the Fermi level of each layer is substantially located at the band edge of the valence band; and (2) $Al_xGa_{1-x}In_{0.5}P$ (0.25≦x≦0.55, in particular, the region 0.35≦x≦0.5) used as the p-type semiconductor spacer layer and $AlyGa_{1-y}As$ (0.4≦y≦1) constituting the DBR region are not direct transition semiconductors but are indirect transition semiconductors, and the band edge in the conduction band is not the Γ point but the X point. It should be noted here that the Γ point is a region where the bottom of the conduction band edge is considered to lie in direct transition semiconductors.

Figure 1:
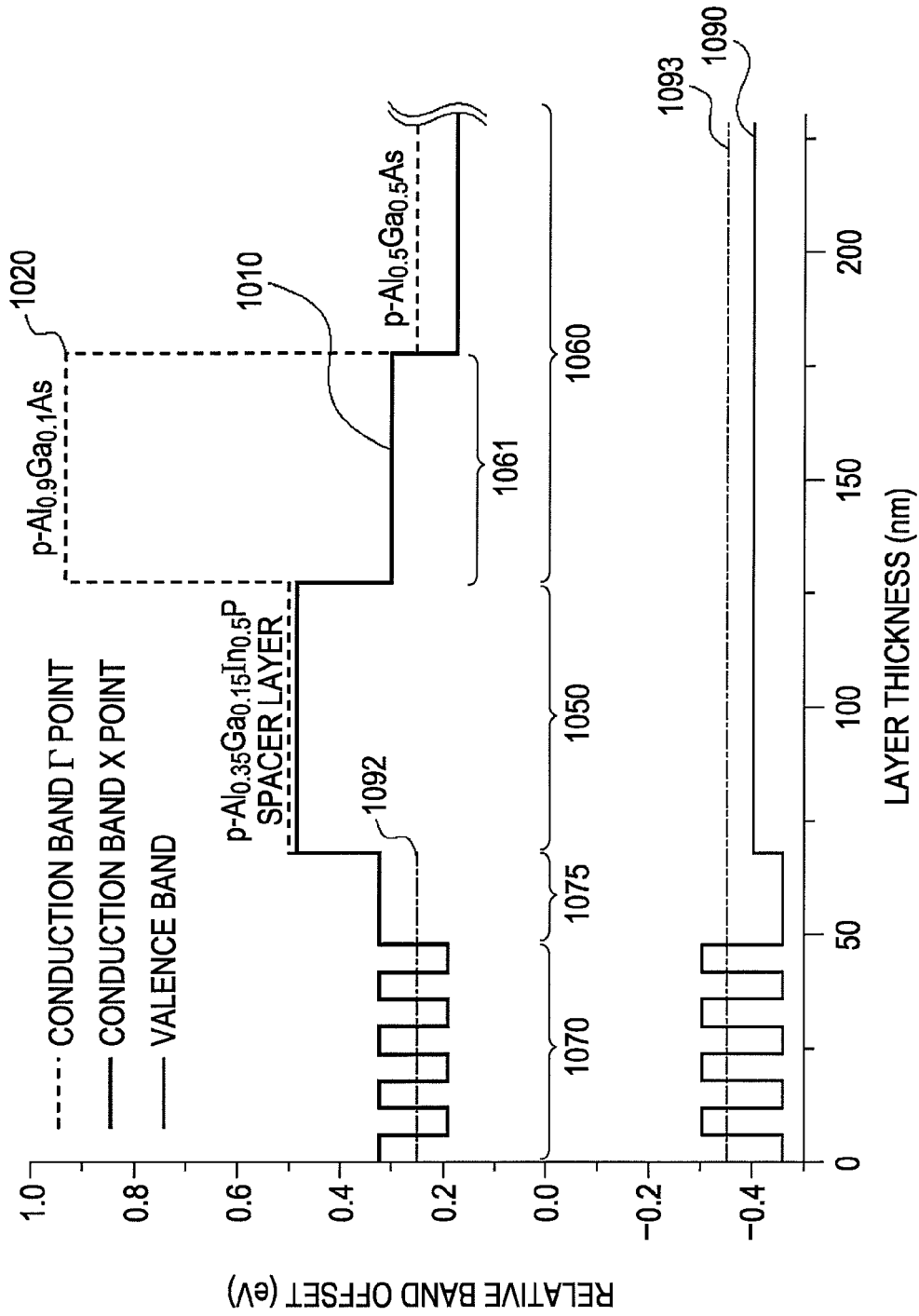
FIG. 1 is a band diagram showing lineups of band edges of an active layer, a p-type semiconductor spacer layer, and a p-type semiconductor multilayer film region of a red surface emitting laser.

On the basis of points (1) and (2), the electron potential, i.e., the band edge lineup of the X points in the conduction band, appears as a solid line 1010 shown in FIG. 1. In FIG. 1, the horizontal axis indicates the thickness of the element, and the vertical axis indicates the band offset with respect to GaAs. The positive-side region is the conduction band side, and the negative-side region is the valence band side.

In FIG. 1, 1050 indicates the p-type semiconductor spacer layer, and 1060 indicates one pair of layers in the p-type DBR region (a plurality of pairs are provided in the actual element). In FIG. 1, the band structure when the p-type semiconductor spacer layer 1050 is composed of p-type $Al_{0.35}Ga_{0.15}In_{0.5}P$ and the p-type DBR region 1060 includes a p-type $Al_{0.9}Ga_{0.1}As$ layer and a p-type $Al_{0.5}Ga_{0.5}As$ layer as a pair is illustrated.

For comparative purposes, a band edge 1020 of the conduction band at the Γ point, a lineup 1090 of the band edge of the valence band, and quasi Fermi levels 1092 and 1093 are included in the graph. For the sake of simplicity, spikes, notches, and the like caused by discontinuation of the band edge energy are not shown in FIG. 1. Since the p-type layers are investigated, the band lineups of the layers doped with a p-type impurity are determined so that the Fermi levels near the valence band are the same.

In $Al_{0.9}Ga_{0.1}As$ constituting the p-type DBR region 1060 (p-type semiconductor multilayer film region), the band edge at the X point (1010 in FIG. 1) is significantly lower than that at the Γ point (1020 in FIG. 1). In particular, the band edge potential of the conduction band of the p-type $Al_{0.9}Ga_{0.1}As$ adjacent to the p-type AlGaInP spacer layer drops by as much as about 200 meV.

In other words, one can establish a band diagram different from the band diagram (FIG. 6) disclosed in Schneider reference.

On the basis of the newly established band diagram described above, the leakage current can again studied as below.

Electrons cross the hetero gap, i.e., the difference between the band edges of the active layer 1070 and the p-type semiconductor spacer layer 1050, and are present in the p-type semiconductor spacer layer 1050. The concentration of such electrons is actually affected by the potential drop at the conduction band edge of $Al_{0.9}Ga_{0.1}As$, which is the constituent of the adjacent p-type DBR region 1060. An undoped barrier layer 1075 in FIG. 1 is provided as necessary.

Thus, it is considered that nearly all electrons near the interface between the p-type semiconductor spacer layer 1050 and a p-type $Al_{0.9}Ga_{0.1}As$ 1061 fall to the p-type $Al_{0.9}Ga_{0.1}As$ side and that electrons having the same energy as that inside the p-type semiconductor spacer layer are scarce near the interface.

In other words, the electron concentration gradient in the p-type semiconductor spacer layer 1050 is extremely large and the diffusion current component can take a very large value.

Thus, the p-type DBR region 1060 does not actually function as a barrier against the carrier electrons that leak over the p-type semiconductor spacer layer 1050.

In other words, the effective thickness of the p-type layer contributing to suppression of the leakage current crossing the p-type semiconductor spacer layer is not the total thickness of the spacer layer and the p-type DBR region, but is the thickness of the p-type semiconductor spacer layer only.

In order to study the leakage current on the basis of this new finding, the leakage current was calculated with the formula below (formula 1).

The leakage current density ($J_{leak}$) is given by the following formula on the basis of the diffusion component and drift component of electrons leaking from the active layer to the p-type semiconductor spacer layer (see D. Bour et al., Journal of Quantum Electronics, Vol. 29, No. 5 (1993) 1337):

$$J_{leak} = qD_n \cdot \qquad (1)$$

$$2\left(\frac{2\pi m_n kT}{h^2}\right)^{\frac{3}{2}} [\exp(-\Delta E/kT)] \left(\sqrt{\frac{1}{L_n^2} + \frac{1}{4Z^2}} \coth\sqrt{\frac{1}{L_n^2} + \frac{1}{4Z^2}} \, x_p + \frac{1}{2Z}\right)$$

$$z = \frac{kT}{q} \cdot \frac{\sigma_p}{J_{total}}$$

where q is the amount of charges, $D_n$ is the diffusion constant of the electron, $m_n$ is the effective mass of the electron, k is the Boltzmann constant, h is the Planck's constant, T is the temperature, $\Delta E$ is the hetero barrier, $L_n$ is the diffusion length of the electron, Z is the effective field length, $\sigma_p$ is the conductivity of the p-type spacer layer, $J_{total}$ is the total injection current density, and $x_p$ is the thickness of the p-type cladding layer.

Figure 2A:
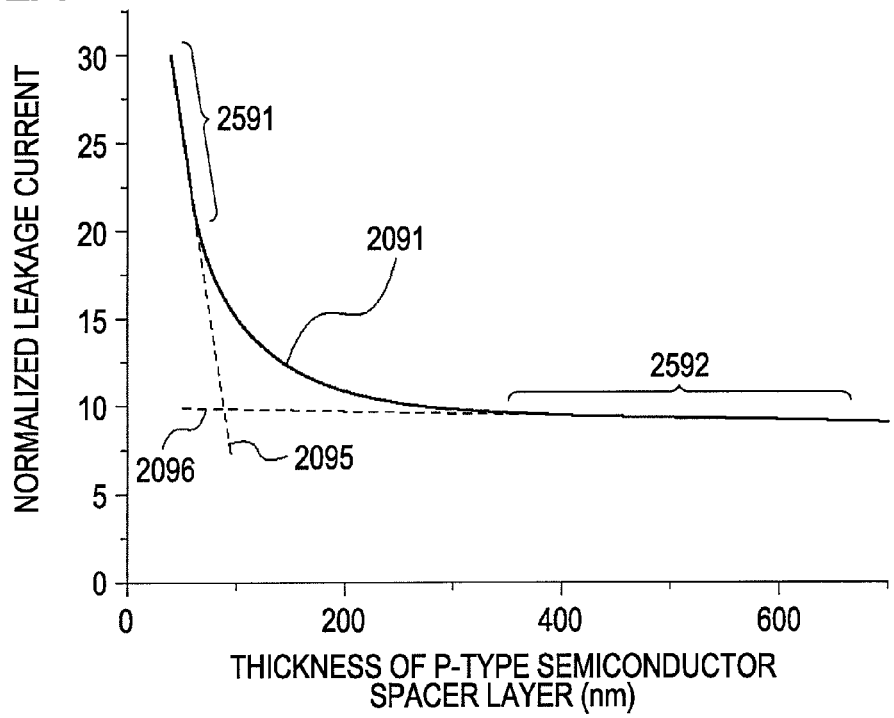
FIG. 2A shows the relationship between the normalized leakage current and the thickness of the p-type semiconductor spacer layer.

FIG. 2A shows the normalized leakage current (solid line 2091) calculated with formula (1) above. The horizontal axis indicates the thickness of the p-type semiconductor spacer layer and the vertical axis indicates the normalized leakage current. It is assumed that the spacer layer is composed of AlGaInP (e.g., $Al_{0.5}In_{0.5}P$ or $Al_{0.35}Ga_{0.25}In_{0.5}P$).

The graph clearly shows that the leakage current (in particular, the diffusion current component) dramatically increases in the region where the thickness of the p-type semiconductor spacer layer is about 80 nm or less. It can be assumed that, in this region, the luminous efficiency is low, high-temperature performance characteristics are poor, and full power operation is difficult.

The thickness of the p-type semiconductor spacer layer disclosed in Crawford reference is "50 nm". The above-described findings show that, with this thickness, the resulting structure is not advantageous for suppressing leakage current.

In other words, while the thickness of the p-type AlGaInP spacer layer typically used in red surface emitting lasers is about 50 nm, our finding indicates that the thickness of the p-type spacer layer must be increased to achieve enhanced high-temperature performance characteristics.

First Embodiment (Red Surface Emitting Laser Element)

A red surface emitting laser element including a multilayer film according to a first embodiment will now be described with reference to FIG. 3.

A laser element 3000 includes a first reflector 302, a second reflector 308 including a p-type semiconductor multilayer film, and an active layer 305 interposed between the first reflector 302 and the second reflector 308. The laser element 3000 also includes a p-type semiconductor spacer layer 307 having a thickness of 100 nm or more and 350 nm or less between the active layer 305 and the second reflector 308.

The reason for making the thickness of the p-type semiconductor spacer layer to 100 nm or more and 350 nm or less will now be described. Note that "thickness" means the length in the stacking direction.

A dotted line 2095 in FIG. 2A is drawn to find the degree of change (inclination) in normalized leakage current with respect to the thickness of the p-type semiconductor spacer layer in the region where the normalized leakage current increases significantly.

The graph shows that the thickness of the p-type semiconductor spacer layer 307 should be outside a region 2591 where the inclination is particularly large and should be 100 nm or more since there may be slight variations depending on the compositional ratio of the material constituting the spacer layer.

In contrast, a dotted line 2096 is drawn to find the degree of change (inclination) in normalized leakage current with respect to the thickness of the p-type semiconductor spacer layer 307 in a region 2592 where the normalized leakage current undergoes a very moderate change. The dotted line 2096 clearly shows that changes in thickness of the spacer layer do not substantially affect the leakage current in the region where the thickness of the p-type spacer layer exceeds 350 nm.

Figure 2B:
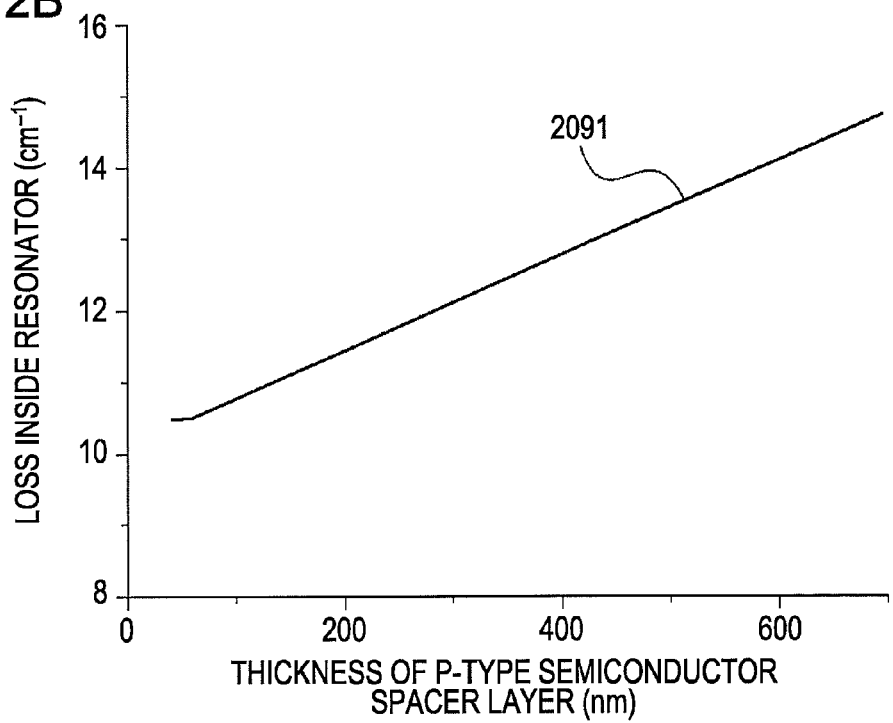
FIG. 2B shows the relationship between the optical loss inside the resonator and the thickness of the p-type semiconductor spacer layer.

Referring now to FIG. 2B, a solid line 2091 shows a change in loss inside the resonator plotted versus the thickness of the p-type spacer layer. In the graph, the mirror loss caused by the reflectors is not considered, and only the loss caused by absorption of the free carriers in the p-type spacer layer and the p-type DBR layer is considered and distributed over the entire cavity length. FIG. 2B clearly shows that the loss inside the resonator increases with the thickness of the p-type spacer layer. In this respect, the thickness of the spacer layer may be as small as possible. The graph shows that even when the thickness of the p-type semiconductor spacer layer is 350 nm, the increase in loss inside the resonator is 20% or less (calculated by assuming the loss inside the resonator to be 12.5 $cm^{-1}$ at 350 nm and 10.5 $cm^{-1}$ at 50 nm).

Thus, the thickness of the p-type semiconductor spacer layer may be 100 nm or more and 350 nm or less.

In the description above relating to the p-type semiconductor spacer layer, the description of the specific compositional ratio is omitted.

It should be noted that in FIG. 2A, the normalized leakage current is calculated on the basis of the following portion in formula (1) while assuming the remainder to be the same:

$$J_{leak} = \alpha \left( \sqrt{\frac{1}{L_n^2} + \frac{1}{4Z^2}} \coth \sqrt{\frac{1}{L_n^2} + \frac{1}{4Z^2}} \, x_p + \frac{1}{2Z} \right)$$

$$z = \frac{kT}{q} \cdot \frac{\sigma_p}{J_{total}}$$

In the calculation, the thickness of the p-type layer is assumed to be the thickness of the p-type AlGaInP spacer layer ($x_p$=40 to 700 nm). Moreover, the doping level of the p-type impurity is assumed to be $1 \times 10^{18}$ $cm^{-3}$, the diffusion length of the electron is assumed to be 1 μm, and the total injection current density $J_{total}$ is assumed to be 3 $kA/cm^2$. In order to normalize the leakage current with respect to the spacer layer, the value of the temperature T is not considered in the calculation. Regarding the inner light absorption, the free carrier absorption of the entire element including the multilayer film reflector (p-type DBR region) is calculated.

The p-type semiconductor spacer layer and the p-type semiconductor multilayer film (p-type DBR region) will now be described in detail.

The materials are selected such that the conduction band edge at the X point of the p-type semiconductor spacer layer 307 is higher than that of one of the two layers constituting a repeating unit of the p-type DBR region (1060 in FIG. 1 and 308 in FIG. 3) that has a higher conduction band edge at the X point. In other words, the materials are selected such that the conduction band edge at the X point in the p-type DBR region is lower than the conduction band edge of the p-type semiconductor spacer layer.

The p-type semiconductor spacer layer 307 may be constituted from a layer containing aluminum, indium, and phosphorus.

When the composition of the p-type semiconductor spacer layer 307 is $Al_xGa_yIn_{1-x-y}P$, the ranges of x and y may be as follows.

First, in order to achieve lattice matching between the $Al_xGa_yIn_{1-x-y}P$ and GaAs, the ratio of indium ("1-x-y" in the compositional formula) may be 0.45 to 0.55, specifically, 0.48 to 0.50.

In other words, $0.45 \leq x+y \leq 0.55$, specifically, $0.50 \leq x+y \leq 0.52$.

Typically, the barrier layer inside the active layer is composed of $Al_{0.2}Ga_{0.3}In_{0.5}P$. To obtain a hetero barrier between the active layer and the p-type semiconductor spacer, the ratio of aluminum (x) may be 0.25 or more, 0.30 or more, or 0.35 or more. The upper limit of the ratio of aluminum in the composition is 0.55 or less and may be 0.52 or less to achieve lattice matching.

The ratio of gallium may be zero. Therefore, one example of the composition of the p-type semiconductor spacer layer is $Al_xGa_yIn_{1-x-y}P$ (where x and y satisfy the aforementioned relationships, $0.45 \leq x+y \leq 0.55$, $0.25 \leq x \leq 0.55$, and $0 \leq y \leq 0.30$).

Alternatively, the composition of the p-type semiconductor spacer layer may be $Al_xGa_yIn_{1-x-y}P$ (where $0.50 \leq x+y \leq 0.52$, $0.35 \leq x \leq 0.52$, $0 \leq y \leq 0.17$).

It should be noted here that the composition may contain other impurities and the like as long as the material can be deposited epitaxially.

When the ratio of indium is 0.5, i.e., when a p-type $Al_zGa_{1-z}In_{0.5}P$ spacer layer is employed, z can be adequately determined in the range of $0.35 \leq z \leq 0.5$, for example. When z is in this range, a spacer layer having a relatively high degree of crystallinity can be easily formed, and the band offset between the active layer and the spacer layer can be increased.

The p-type semiconductor spacer layer 307 may employ a multi quantum barrier (MQB) structure.

Of the two layers constituting the repeating unit of the second reflector 308, one having a higher conduction band edge (when both layers are composed of AlGaAs, the one having a larger aluminum ratio) may have a composition, $Al_xGa_{1-x}As$ ($0.70 \leq x \leq 1.0$, in particular, $0.8 \leq x \leq 1.0$).

The p-type semiconductor multilayer film constituting the second reflector 308 includes a plurality of stacked repeating units each including a first layer and a second layer having different refractive indices. At least one of the first and second layers may contain aluminum, gallium, and arsenic, as described above.

Of the two layers constituting the repeating unit, the composition of the layer having a lower conduction band edge may be $Al_xGa_{1-x}As$ ($0.40 \leq x \leq 0.70$, in particular, $0.45 \leq x > 0.60$). In the composition, x is set to 0.4 or more so that the wavelength of the light emitted from the active layer is not absorbed and that a sufficient reflective index can be achieved with respect to other layers constituting the DBR, although this may depend upon the emission wavelength from the active layer. For example, when the composition of the layer is $Al_xGa_{1-x}As$, x=0.5.

In FIG. 1, of the layers constituting the second reflector 308 (p-type semiconductor multilayer film), one having a higher conduction band edge at the X point is illustrated to be adjacent to the p-type semiconductor spacer layer 1050. However, this arrangement is not essential. For example, of the layers constituting the DBR region, one having a lower conduction band edge at the X point may be adjacent to the p-type semiconductor spacer layer 1050.

(a) Structure of Resonator

In order to obtain a p-type semiconductor spacer layer having the above mentioned thickness, a cavity length larger than 1 wavelength is desirable. For example, a cavity length of 1.5 wavelength or more may be employed.

The p-type semiconductor spacer layer (1050 in FIG. 1 and 307 in FIG. 3) may be a p-type AlGaInP spacer layer having a thickness of 100 nm or more and 350 nm or less, in particular, 150 nm or more and 300 nm or less.

Examples of the cavity length is 1.5 wavelength and 2 wavelength. In order to obtain such a cavity length, the thickness of the p-type semiconductor spacer layer may be increased so that the cavity length increases by a 0.5 wavelength increment. Since 0.5 wavelength corresponds to about 100 nm, the thickness is 160 nm (in the cases where 0.5 wavelength is added) and 260 nm (in the cases where 1 wavelength is added) when combined with an ordinary p-type AlGaInP layer having a thickness of about 60 nm. Thus, the thickness of the p-type semiconductor spacer layer can be 150 nm or more and 300 nm or less in particular so as to include the cases where 0.5 wavelength is added and where 1 wavelength is added.

With respect to the resonator structure of this embodiment, the cavity length can be 1.5 wavelength or more, and the upper limit of the cavity length is 4 wavelength or less, preferably 3.5 wavelength or less, and more preferably 2.5 wavelength or less. "Cavity length" is the thickness of the region between the first and second reflectors in the stacking direction.

Figure 3:
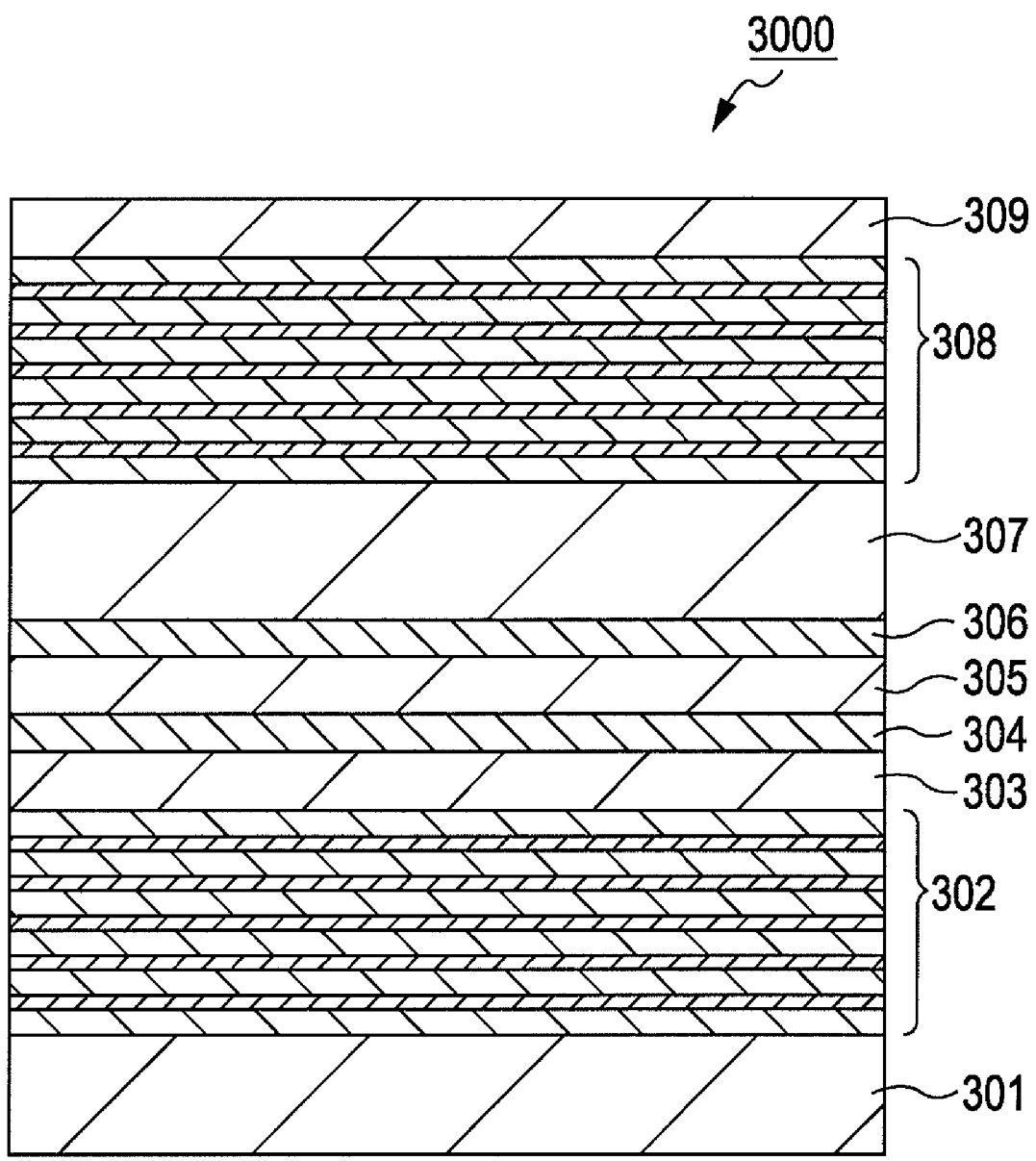
FIG. 3 is a schematic cross-sectional view showing a layer structure of a red surface emitting laser according to a first embodiment.

Referring now to FIG. 3, an n-type semiconductor spacer layer 303 located at a substrate 301 side of the active layer 305 is not essential in terms of carrier overflow and may be provided according to need.

Since the leakage current of the holes into the n-type semiconductor spacer layer 303 (e.g., AlGaInP) is sufficiently small, the thickness of the n-type semiconductor spacer layer 303 may be about 40 nm to 80 nm.

In other words, the resonator of the present invention includes the active layer 305, the p-type semiconductor spacer layer 307, and the n-type semiconductor spacer layer 303. The resonator may have an asymmetrical structure in which the active layer 305 is not located at the center in the cavity length direction.

In particular, the thickness of the p-type semiconductor spacer layer 307 can be larger than the thickness of the n-type semiconductor spacer layer 303. Note that the "asymmetrical structure" means a structure in which the p-type semiconductor spacer layer 307 is thicker than the n-type semiconductor spacer layer 303 and the active layer 305 is not disposed at the center of the resonator. The element structure may be designed such that the center of the active layer aligns with an anti-node of the standing wave of the light intensity inside the element (also referred to as "inner light intensity standing wave" hereinafter).

Referring to FIG. 3, layers 304 and 306 adjacent to the active layer 305 are undoped spacer layers (spacer layers having a lower impurity concentration lower than the p-type and n-type semiconductor spacer layers 307 and 303) that may be provided if necessary. The layers 304 and 306 are not essential in this embodiment, but can be formed as barrier layers for blocking diffusion of impurities from the p-type semiconductor spacer layer 307 and n-type semiconductor spacer layer 303 into the active layer 305. The thickness of the layers 304 and 306 can be 10 nm or more and 50 nm or less, in particular, 20 nm or more and 40 nm or less.

In an AlGaInP-based semiconductor laser, a GaInP quantum well structure may be employed in the active layer to achieve emission of red light. Examples of the p-type semiconductor spacer layer 307 include an $Al_{0.35}Ga_{0.15}In_{0.5}P$ layer and an $Al_{0.5}In_{0.5}P$ layer.

The structures of the layers of the red surface emitting laser of this embodiment will now be described with specific materials.

For example, an $Al_xGa_{0.5-x}In_{0.5}P$ layer ($0.2 \leq x \leq 0.5$) having a thickness of about 170 nm may be used as the p-type semiconductor spacer layer 307. Since holes having a large effective mass rarely cross the n-type semiconductor spacer layer 303 composed of $Al_xGa_{0.5-x}In_{0.5}P$ ($0.2 \leq x \leq 0.5$) and contribute to the leakage current, the thickness of the n-type AlGaInP layer may be as usual, e.g., about 50 nm.

The active layer 305 is designed to have a multi quantum well structure favored in surface emitting lasers and the thickness thereof is about 40 nm to about 50 nm. Thus, the cavity length of the resonator as a whole should be designed to be at least 1.5 wavelength.

Since the active layer 305 aligns with the anti-node of the inner light intensity standing wave, the active layer 305 is not located at the center of the 1.5 wavelength cavity length. Thus, the structure of the resonator has an asymmetrical structure instead of a symmetrical structure common to usual 1 wavelength resonators.

In some cases, the symmetrical structure is advantageous in that the position of the active layer can be easily aligned with the anti node of the inner light intensity standing wave while adjusting the resonant wavelength to a desired value during crystal growth. Thus, the thickness of the n-type AlGaInP spacer layer is increased to be the same as the thickness of the p-type AlGaInP layer. For example, the thickness of the n-type AlGaInP spacer layer may be adjusted to about 170 nm so that a resonator having a symmetrical structure can be formed. In such a case, according to the examples described above, the cavity length is 2 wavelength. Since absorption of free carriers in the n-type spacer layer is smaller than in the p-type layer, the problem of optical absorption by the thick n-type layer is not as serious as in the p-type layer.

As a result, a novel red surface emitting laser element in which the leakage current is reduced and the optical absorption does not significantly increase by the increase in thickness of the spacer layer can be provided.

b) Other Structures

In FIG. 3, the substrate 301 (e.g., a GaAs substrate) is illustrated but may be omitted according to need. For example, the substrate composed of GaAs and other suitable material may be used to deposit a multilayer film thereon and then removed. Alternatively, the multilayer film may be transferred to another substrate such as a silicon substrate, a silicon-on-insulator (SOI) substrate a germanium substrate, a plastic substrate, or a transparent substrate such as a glass substrate. In order to enhance heat dissipation, the light emitting element may be transferred on a silicon substrate or a SOI substrate. In transferring the film, a polishing technique or a grinding technique may be used to remove the deposition substrate. Alternatively, a sacrificial layer may be formed on the deposition substrate and then the layers constituting the element may be formed on the sacrificial layer to facilitate the transfer of the film.

The second reflector 308 (p-type semiconductor multilayer film) can contain aluminum and arsenic. The second reflector 308 includes a plurality of units each including a first layer and a second layer having different refractive indices. At least one of the first and second layers may be a layer containing aluminum, gallium, and arsenic.

The material of the second reflector 308 is not limited to AlAs and AlGaAs and may be any semiconductor material having a lattice that matches with the lattice of GaAs.

The first reflector 302 may be an n-type semiconductor multilayer film. An n-type AlGaInP spacer layer (303 in FIG. 3) may be provided between the first reflector 302 and the active layer 305.

The first reflector 302 does not need to be an n-type DBR as long as electrical current can be injected into the laser element 3000. If a bonding technique is employable, a photonic crystal may be used as the reflector instead of the semiconductor multilayer film.

In FIG. 3, spacer layers 304 and 306 are provided between the active layer 305 and the p-type and n-type spacer layers 303 and 307 but may be omitted according to need. In FIG. 3, the first reflector 302 (n-type DBR region) is provided at the substrate 301 side and the second reflector 308 (p-type DBR region) is provided above the active layer. However, this arrangement may be reversed. For example, the p-type DBR region or the p-type spacer layer may be disposed between the active layer and the substrate.

Figure 8:
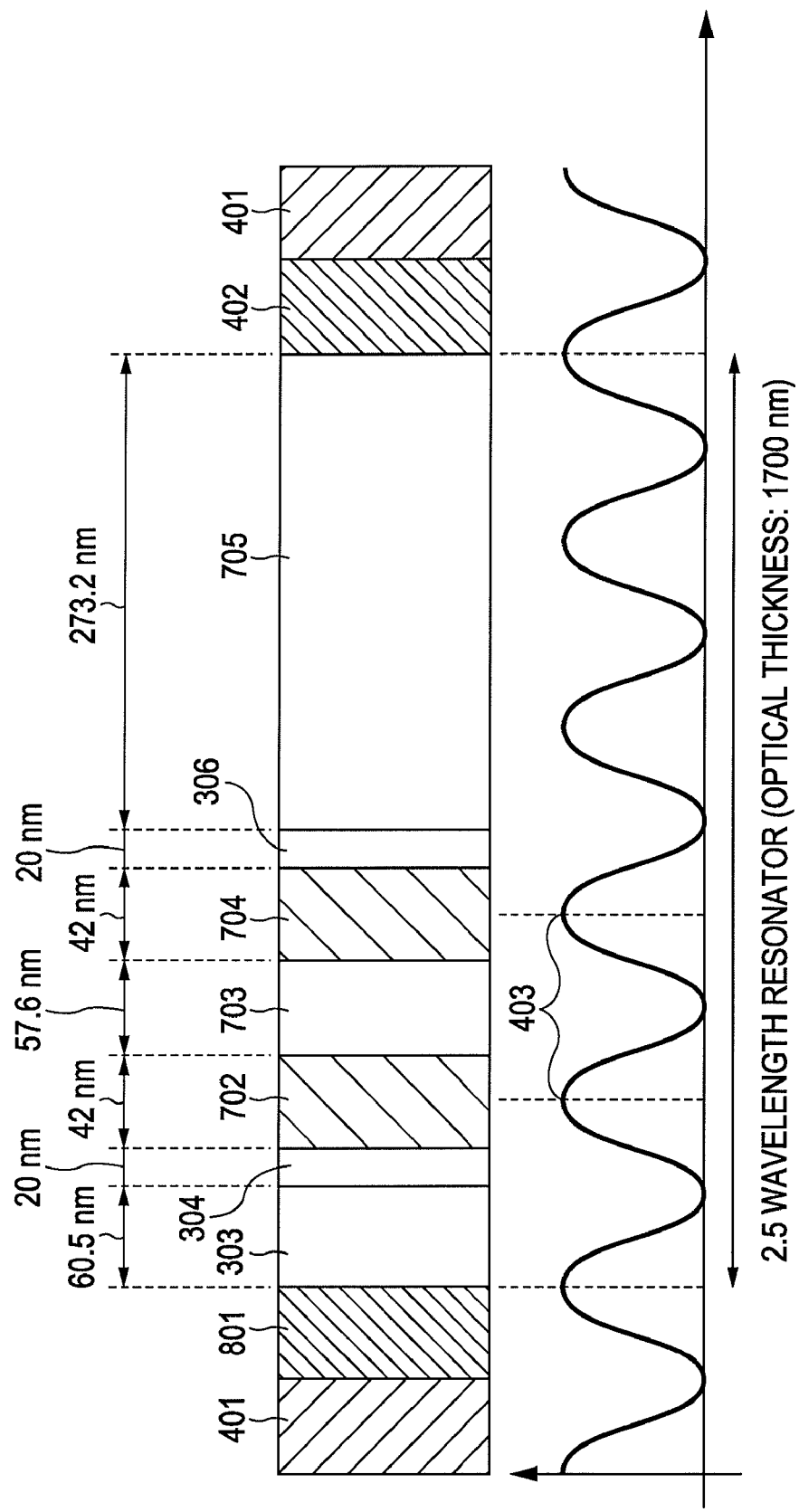
FIG. 8 is a schematic cross-sectional view showing a resonator structure of Example 2.

An example of the structure of the active layer 305 is a quantum well active layer including a GaInP layer and an AlGaInP layer. In this embodiment, the structure may be any structure that can output red light (light having a wavelength of 0.6 µm to 0.73 µm, in particular, 0.63 µm to 0.72 µm). For example, an active layer having a double hetero structure or a quantum dot structure may be employed, and AlGaInPN and other suitable materials may be used as the active layer. Alternatively, as described below with reference to FIGS. 8 and 10, a plurality of active layers may be used. For example, as shown in FIG. 8, two or more active layers may be used.

As described above, the resonator includes the active layer 305, the p-type semiconductor spacer layer 307, and the n-type semiconductor spacer layer 303 and can take an asymmetrical structure in which the active layer is not disposed at the center in the cavity length direction.

The thickness of the p-type AlGaInP semiconductor spacer layer 307 can be larger than the thickness of the n-type AlGaInP semiconductor spacer layer 303.

In this embodiment, the thicknesses of the layers in the DBR region may be designed to form a vertical cavity surface emitting laser; however, the emission does not have to be exactly vertical as long as surface emission is possible.

This embodiment is suitable for laser elements required to achieve a laser operation at high temperature. In particular, the embodiment is effective when applied to single transverse mode laser elements exhibiting high light output power.

Second Embodiment

A red surface emitting laser element including a multilayer film according to a second embodiment of the present invention will now be described with reference to FIG. 3 as with the first embodiment.

The element includes the first reflector 302, the second reflector 308 including a p-type AlGaAs semiconductor multilayer film, and the active layer 305 interposed between the first reflector 302 and the second reflector 308. The element also includes a p-type AlInP or AlGaInP semiconductor spacer layer 307 having a thickness of 100 nm or more and 350 nm or less between the active layer 305 and the second reflector 308.

The p-type semiconductor spacer layer can contain both AlInP and AlGaInP if the thickness of the p-type semiconductor spacer layer as a whole is within the above-described range.

This structure provides a novel red surface emitting laser element in which the leakage current is reduced.

Note that the notations "AlGaAs" and "AlGaInP" indicate that the former layer contains aluminum, gallium, and arsenic, and the latter layer contains aluminum, gallium, indium, and phosphorus. The compositional ratios are not particularly limited as long as the layers can be grown epitaxially and emission of red light is achieved. The descriptions in the first embodiment can be applied to the laser element of the second embodiment as long as there is no inconsistency.

Third Embodiment

A red surface emitting laser element including a multilayer film according to a third embodiment will now be described with reference to FIG. 3 as in the above-described embodiments.

The element includes the first reflector 302, the second reflector 308 including a p-type semiconductor multilayer film, the active layer 305 interposed between the first reflector 302 and the second reflector 308, and the p-type semiconductor spacer layer 307 between the active layer 305 and the second reflector 308.

As described with reference to FIG. 1, the conduction band edge at the point X of the p-type semiconductor multilayer film is lower than that of the p-type semiconductor spacer layer 307, and the thickness of the p-type semiconductor spacer layer 307 in the stacking direction is 100 nm or more and 350 nm or less.

Although the leakage current cannot be sufficiently decreased due to the presence of the second reflector 308 including the p-type semiconductor multilayer film, the leakage current can be reduced by adjusting the thickness of the p-type semiconductor spacer layer 307 to 100 nm or more and 350 nm or less (see FIG. 2A).

The descriptions in the first embodiment can be applied to the laser element of the third embodiment as long as there is no inconsistency.

Fourth Embodiment (Image Forming Device and Image Display Apparatus)

The red surface emitting laser elements described in the first to third embodiments may be applied to an image forming device or an image display apparatus, for example.

Figure 9A:
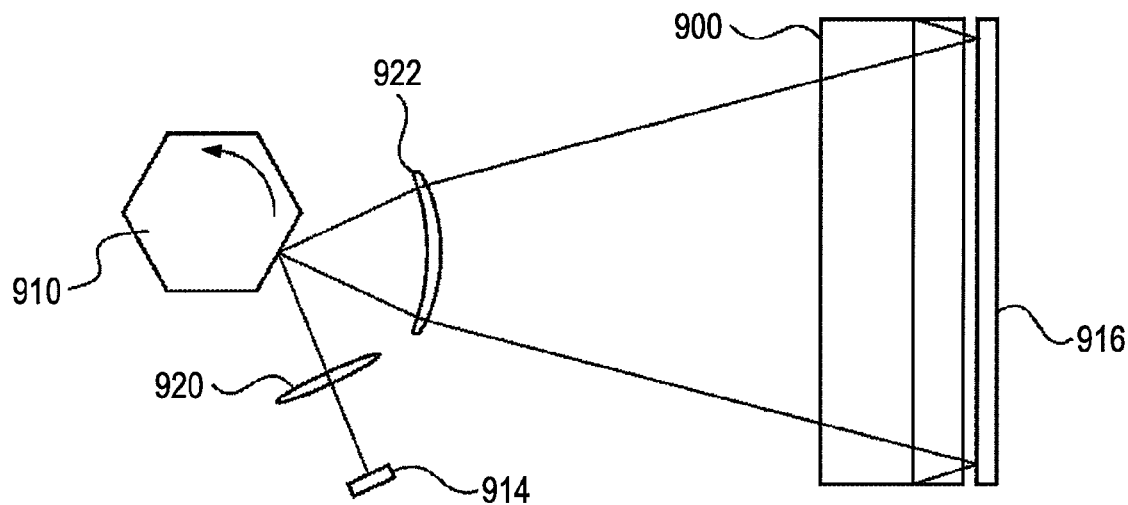
FIGS. 9A and 9B are schematic diagrams of an image-forming device.
Figure 9B:
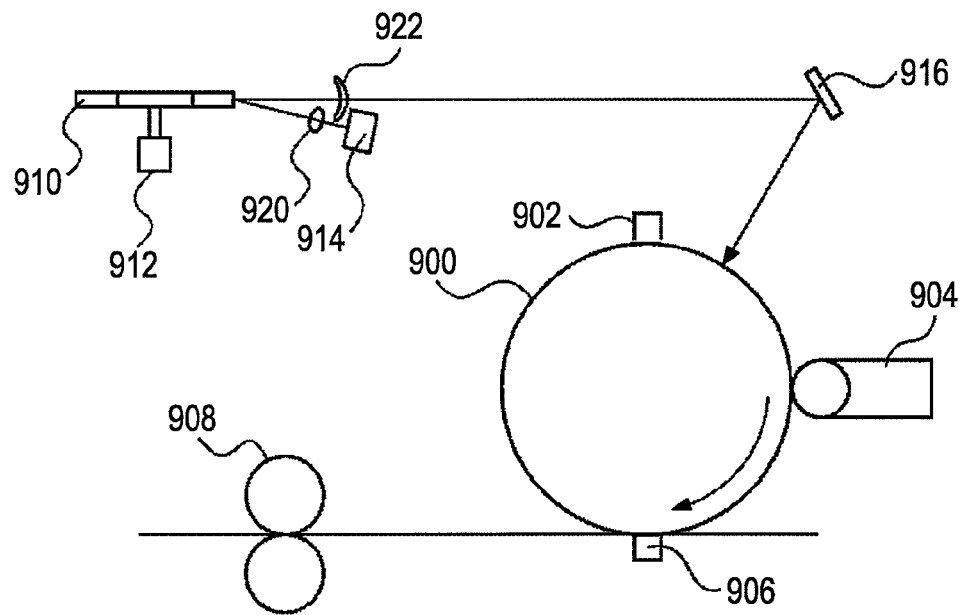

When the element is applied to an image forming device, as shown in FIGS. 9A and 9B, the image forming device includes a red surface emitting laser element 914 and a light deflector 910 for reflecting the laser beam output from the laser element so as to conduct scanning. The light deflector 910 may have any structure that can reflect the laser beam and scan the direction of reflection.

Examples of the light deflector 910 include a multi-faceted mirror, a polygonal mirror, and a reflector formed by vibrating a laminate composed of silicon or the like by using a micro electro mechanical system (MEMS).

If the device is an electrophotographic device, a drum-shaped photosensitive member 900, a charger 902, a developer 904, and a fixer 908 for forming an electrostatic latent image by the beam deflected by the light deflector 910 are provided. The details of the electrophotographic device will be described through examples below.

The red surface emitting laser element can be used in combination with the deflector and other associated components so as to form an image display apparatus such as a display.

Alternatively, many red surface emitting laser elements may be arranged into an array so that a multi beam image forming device can be formed.

EXAMPLES

Example 1

Example 1 will now be described. FIG. 3 is a schematic cross-sectional view of a layer structure of a red surface emitting laser element of the example 1.

The vertical cavity surface emitting laser (VCSEL) of the example 1 includes an n-type GaAs substrate 301, an n-type $Al_{0.9}Ga_{0.1}As/Al_{0.5}Ga_{0.5}As$ multilayer film reflector 302, an n-type $Al_{0.35}Ga_{0.15}In_{0.5}P$ spacer layer 303, an undoped $Al_{0.25}Ga_{0.25}In_{0.5}P$ barrier layer 304, a $Ga_{0.56}In_{0.44}P/Al_{0.25}Ga_{0.25}In_{0.5}P$ quantum well active layer 305, an undoped $Al_{0.25}Ga_{0.25}In_{0.5}P$ barrier layer 306, a p-type $Al_{0.5}In_{0.5}P$ spacer layer 307, a p-type $Al_{0.9}Ga_{0.1}As/Al_{0.5}Ga_{0.5}As$ multilayer film reflector 308, and a p-type GaAs contact layer 309. A red surface emitting laser element emitting light having a wavelength of 680 nm is formed thereby.

First, the n-type $Al_{0.9}Ga_{0.1}As/Al_{0.5}Ga_{0.5}As$ multilayer film reflector 302 and the p-type $Al_{0.9}Ga_{0.1}As/Al_{0.5}Ga_{0.5}As$ multilayer film reflector 308 are described. Each of the $Al_{0.9}Ga_{0.1}As$ layer and the $Al_{0.5}Ga_{0.5}As$ layer is formed to have an optical thickness of a quarter wave.

In an actual element, a composition gradient layer about 20 nm in thickness is provided between the $Al_{0.9}Ga_{0.1}As$ layer and the $Al_{0.5}Ga_{0.5}As$ layer to decrease the electrical resistance.

In such cases, the total thickness including the thickness of the composition gradient layer is designed to be the optical thickness of a quarter wave. In order to allow the current to flow, the p-type multilayer film reflector 308 is doped with an impurity acting as an acceptor, such as carbon or zinc. The n-type multilayer film reflector 302 is doped with an impurity acting as a donor, such as silicon or selenium. In order to reduce absorption of light inside the multilayer film reflector as much as possible, a modulated doping may be conducted so that the doping level is low at the anti-node and high at the node of the light intensity standing wave inside the multilayer film reflector.

In this example, the light is output from the epitaxial layer surface, i.e., the p-type layer side. Thus, the p-type multilayer film reflector 308 is designed to include about thirty six repeating pairs to form a reflector exhibiting the optimum light output efficiency. Since light is not output from the n-type layer side, the n-type multilayer film reflector 302 is designed to include about sixty repeating pairs to increase the reflectivity as much as possible to decrease the threshold current.

In the p-type multilayer film reflector 308, an $Al_{0.98}Ga_{0.02}As$ layer having a thickness of about 30 nm may be inserted at a position 1 to 3 pairs from the active layer, and the $Al_{0.98}Ga_{0.02}As$ layer may be selectively oxidized to form a current-confining structure.

The process of making the resonator will now be described.

Figure 4:
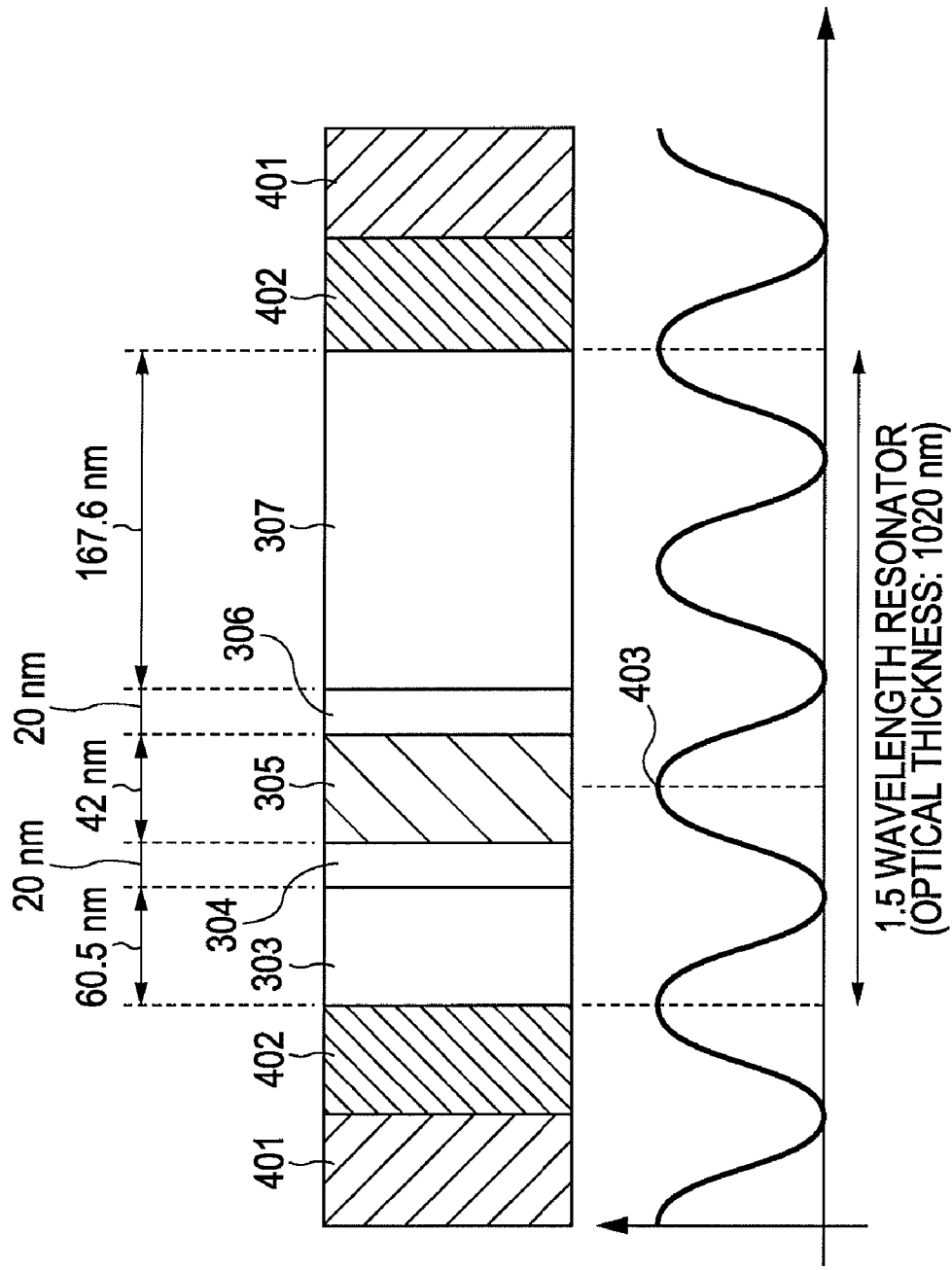
FIG. 4 is a schematic cross-sectional view showing a resonator structure of Example 1.

Since the thickness of the p-type $Al_{0.5}In_{0.5}P$ spacer layer 307 is set to 100 nm or more and 350 nm or less, the cavity length is 1.5 wavelength as shown in FIG. 4 instead of 1 wavelength usually employed.

Since the emission wavelength is 680 nm, 1.5 wavelength gives an optical thickness of 1020 nm. The layers constituting the resonator are all composed of AlGaInP. However, AlGaInP materials with different compositional ratios are used for the active layer, barrier layer, spacer layer, and other layers. Thus, the thickness of each layer should be determined on the basis of the refractive index so that the cavity length is 1.5 wavelength.

In order to maximize the interaction between light and carriers, the active layer must be disposed at an anti-node 403 of the standing wave. In other words, the active layer 305 is disposed at a position one third of 1020 nm from one end, and the n-type layer is disposed in a smaller region (the left-hand side of the active layer 305 in FIG. 4) and the p-type layer is disposed in a larger region (the right-hand side of the active layer 305 in FIG. 4).

The actual examples will be described in detail below while considering the above-described conditions.

The active layer 305 includes four 6 nm GaInP quantum wells and three 6 nm $Al_{0.25}Ga_{0.25}In_{0.5}P$ barrier layers. The actual thickness of the active layer 305 is 42 nm.

Since the refractive indices of the GaInP layer and the $Al_{0.25}Ga_{0.25}In_{0.5}P$ layer at an emission wavelength of 680 nm are 3.56 and 3.37, respectively, the optical thickness of the active layer is 146 nm.

It is necessary that the sum of one half of the optical thickness of the active layer region (73 nm), the optical thickness of the undoped $Al_{0.25}Ga_{0.25}In_{0.5}P$ barrier layer 304, and the optical thickness of the n-type $Al_{0.35}Ga_{0.15}In_{0.5}P$ spacer layer 303 be 340 nm, i.e., one third of 1020 nm.

Thus, the undoped $Al_{0.25}Ga_{0.25}In_{0.5}P$ barrier layer 304 is formed to have a thickness of 20 nm, and the n-type $Al_{0.35}Ga_{0.15}In_{0.5}P$ spacer layer 303 is formed to have a thickness of 60.5 nm. Since the refractive indices of the layers 304 and 303 are 3.37 and 3.30, respectively, the total optical thickness of these two layers is 267 nm.

In other words, the total of 73 nm, which is one half of the optical thickness of the active layer 305, and 267 nm is 340 nm, and as shown in FIG. 4, the center of the active layer 305 aligns with the anti node 403 of the standing wave.

With respect to the p-type layer side, it is necessary that the sum of one half of the optical thickness of the active layer 305 (73 nm) and the optical thicknesses of the undoped $Al_{0.25}Ga_{0.25}In_{0.5}P$ barrier layer 306 and the p-type $Al_{0.5}In_{0.5}P$ spacer layer 307 be the remainder, i.e., 680 nm.

Although the $Al_{0.35}Ga_{0.15}In_{0.5}P$ layer is used at the n-type layer side, $Al_{0.5}In_{0.5}P$ layers are used at the p-type layer side to increase the hetero barrier as much as possible, and doping is conducted up to about $1\times10^{18}$ cm$^{-3}$. Zinc or magnesium may be used as a dopant.

The barrier layer 306 is formed to have a thickness of 20 nm, and the p-type $Al_{0.5}In_{0.5}P$ spacer layer 307 is formed to have a thickness of 167.6 nm. Since the refractive indices of the layers 306 and 307 are 3.37 and 3.22, respectively, the total optical thickness of these two layers is 607 nm. The sum of 607 nm and one half of the optical thickness of the active layer 305, i.e., 73 nm, is 680 nm.

As is described above, the optical thicknesses of the n-type layer including the undoped barrier layer, the active layer, and the p-type layer including the undoped barrier layer are 267 nm, 146 nm, and 607 nm (total: 1020 nm), respectively. The total corresponds to the optical thicknesses for a 1.5 wavelength resonator.

The thickness of the p-type layer is 167.6 nm, which is in the range of 100 nm or more and 350 nm or less.

Multilayer film reflectors are formed at the both sides of the resonator. Both n-side and p-side multilayer film reflectors are arranged so that the interfaces between the resonator and the multilayer film reflectors align with the anti nodes of the standing wave.

To be more specific, a low refractive index material, i.e., an $Al_{0.9}Ga_{0.1}As$ layer 402, is in contact with the resonator, and a high refractive index material, i.e., an $Al_{0.5}Ga_{0.5}As$ layer 401, is disposed adjacent to the $Al_{0.9}Ga_{0.1}As$ layer 402. A required number of pairs of the layers 401 and 402 is repeatedly provided (36 pairs at the p-side and 60 pairs at the n-side).

In actual device fabrication, a wafer having layers with thicknesses described above is formed by a crystal growth technique.

Figure 5:
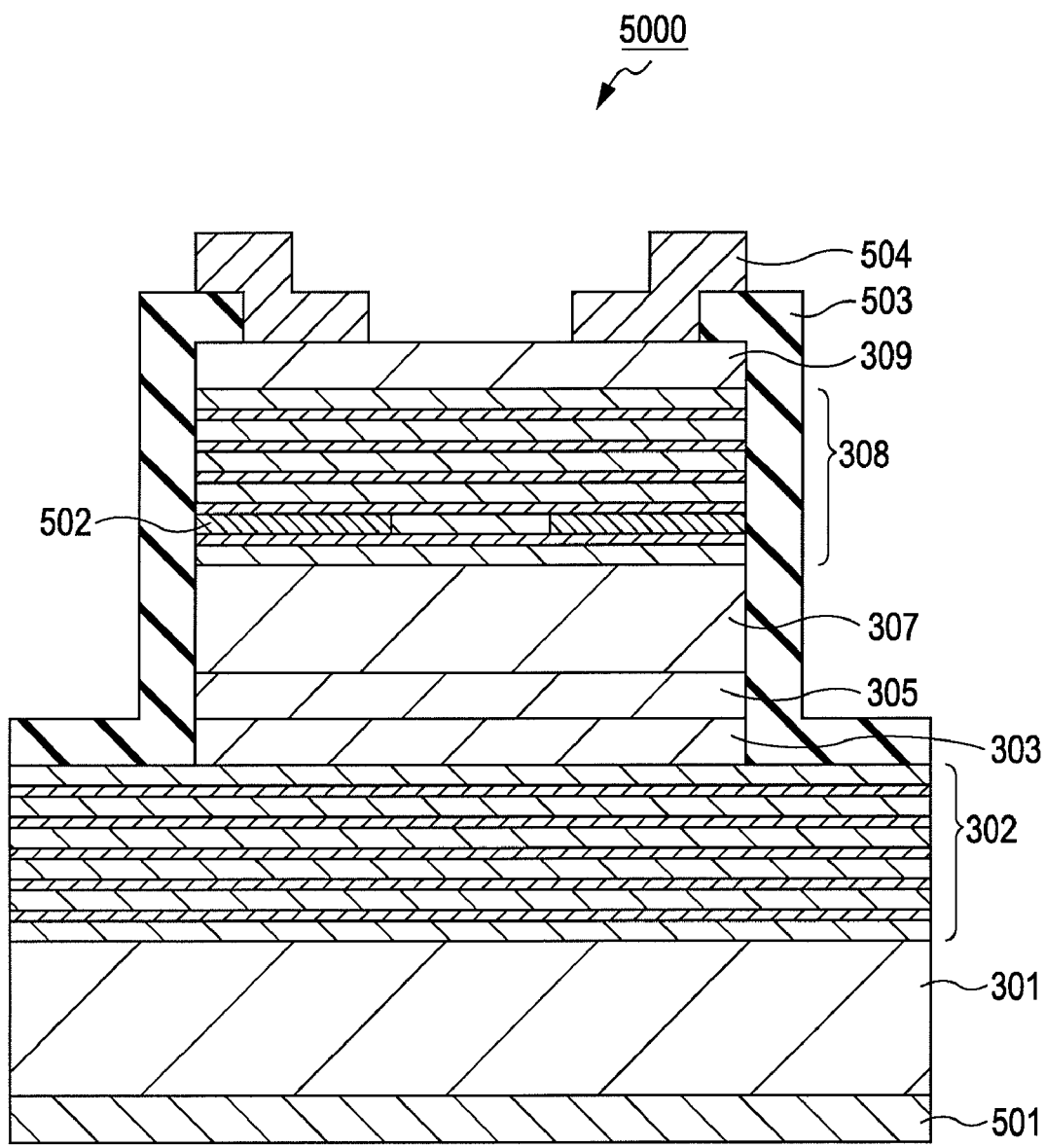
FIG. 5 is a schematic cross-sectional view of a laser element of Example 1.

For example, layers are formed by an organometallic chemical vapor deposition system or a molecular beam epitaxy system. After the wafer is formed, a laser element 5000 shown in FIG. 5 is formed by a regular semiconductor process. Note that in FIG. 5, the layers having the same functions as the layers described with reference to FIG. 3 are represented by the same reference numerals.

A post is formed by photolithography and semiconductor etching, and a current confining layer 502 is formed by selective oxidation. Subsequently, an insulating film 503 is formed and is partly removed to expose a portion of the p-type GaAs contact layer 309 for contact, and a p-side electrode 504 is formed. Finally, an n-side electrode 501 is formed on the rear surface of the wafer to conclude fabrication of the element.

The element fabricated as above can achieve high-temperature operation and full-power operation and extend the range of application of the red surface emitting laser elements.

The description above provides a process of making one element.

In making a plurality of elements integrated into an array, for example, in aligning thirty two elements into a 4 by 8 array at a pitch of 50 μm, a photomask having the target element arrangement is used from the initial stage. A plurality of elements arranged into an array can then be simultaneously formed by using the same epiwafer as above by the same process for making the element. In other words, a red surface emitting laser array can be easily obtained by using a mask with a target pattern.

Note that the element described above is formed by using an n-type GaAs substrate and the p-type layer is disposed in the upper part. Alternatively, a p-type GaAs substrate may be used in forming the element so that the element includes the n-type layer in the upper part.

Example 2

Figure 7:
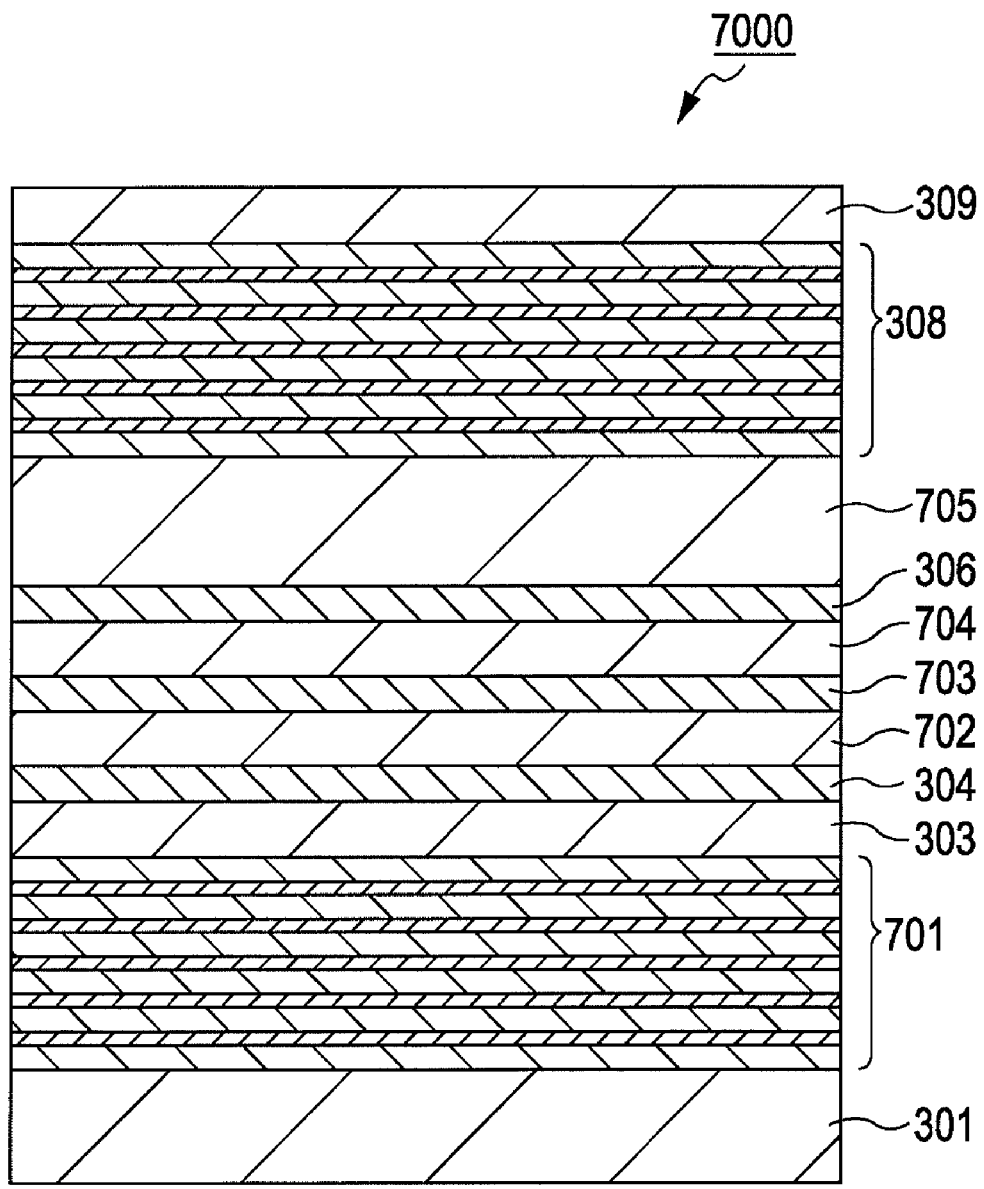
FIG. 7 is a schematic cross-sectional view showing a layer structure of a red surface emitting laser of Example 2.

Example 2 will now be described. FIG. 7 is a schematic cross-sectional view of a layer structure of a red surface emitting laser element 7000 of Example 2.

The VCSEL structure of this example includes an n-type GaAs substrate 301, an n-type $AlAs/Al_{0.5}Ga_{0.5}As$ multilayer film reflector 701, an n-type $Al_{0.35}Ga_{0.15}In_{0.5}P$ spacer layer 303, an undoped $Al_{0.25}Ga_{0.25}In_{0.5}P$ barrier layer 304, a first $Ga_{0.56}In_{0.44}P/Al_{0.25}Ga_{0.25}In_{0.5}P$ quantum well active layer 702, an $Al_{0.25}Ga_{0.25}In_{0.5}P$ intermediate barrier layer 703, a second $Ga_{0.56}In_{0.44}P/Al_{0.25}Ga_{0.25}In_{0.5}P$ quantum well active layer 704, an undoped $Al_{0.25}Ga_{0.25}In_{0.5}P$ barrier layer 306, a p-type $Al_{0.35}Ga_{0.15}In_{0.5}P$ spacer layer 705, a p-type $Al_{0.9}Ga_{0.1}As/Al_{0.5}Ga_{0.5}As$ multilayer film reflector 308, and a p-type GaAs contact layer 309. A red surface emitting laser emitting light having a wavelength of 680 nm is made thereby.

The n-type multilayer film reflector 701 is composed of AlAs instead of $Al_{0.9}Ga_{0.1}As$. This is because AlAs has a small thermal resistance and can decrease the thermal resistance of the element as a whole.

The p-type $Al_{0.9}Ga_{0.1}As/Al_{0.5}Ga_{0.5}As$ multilayer film reflector 308 is the same as that of the example 1 (FIG. 3).

As shown in FIG. 7, in this example, a periodic gain structure including two multi quantum well structures is employed. This structure increases the optical confinement ratio and mode gain, and high emission output can be easily obtained.

In addition to employing the periodic gain structure described above, the cavity length is set to 2.5 wavelength to make the thickness of the p-type AlGaInP layer in the range of 100 nm or more and 350 nm or less, as shown in FIG. 8.

The layer structure of the resonator will now be described with reference to FIG. 8.

Since the resonant wavelength is 680 nm and the cavity length is 2.5 wavelength, the optical thickness is 1700 nm.

Layers in the resonator are all composed of AlGaInP. However, since AlGaInP materials with different compositional ratios are used for the active layer, barrier layer, spacer layer, and other layers, the thickness of each layer should be determined on the basis of the refractive index so that the cavity length is 2.5 wavelength.

Moreover, in order to maximize the interaction between light and carriers, the active layers 702 and 704 must be disposed at anti nodes 403 of the inner light intensity standing wave. In other words, the two active layers are disposed at a position one fifth of 1700 nm and a position two fifth of 1700 nm from one end, respectively, and the n-type layer is disposed in a smaller region (the left-hand side region in FIG. 8) and the p-type layer is disposed in a larger region (the right-hand side region in FIG. 8).

The actual examples will be described in detail below while considering the above-described conditions.

Each of the first and second active layers 702 and 704 includes four 6 nm GaInP quantum wells and three 6 nm $Al_{0.25}Ga_{0.25}In_{0.5}P$ barrier layers and has an actual thickness of 42 nm. Since the refractive indices of the GaInP layer and the $Al_{0.25}Ga_{0.25}In_{0.5}P$ layer are 3.56 and 3.37, respectively, at 680 nm, the optical thickness of each active layer is 146 nm.

It is necessary that the sum of one half of the optical thickness of the active layer region (73 nm) and the optical thicknesses of the undoped $Al_{0.25}Ga_{0.25}In_{0.5}P$ barrier layer 304 and the n-type $Al_{0.35}Ga_{0.15}In_{0.5}P$ layer 303 be 340 nm.

Thus, the undoped $Al_{0.25}Ga_{0.25}In_{0.5}P$ barrier layer 304 is formed to have a thickness of 20 nm, and the n-type $Al_{0.35}Ga_{0.15}In_{0.5}P$ layer 303 is formed to have a thickness of 60.5 nm. Since the refractive indices of the layers 304 and 303 are 3.37 and 3.30, respectively, the total optical thickness of these two layers is 267 nm. The sum of 267 nm and one half of the optical thickness of the first active layer 702, i.e., 73 nm, is 340 nm.

In other words, as shown in FIG. 8, the center of the first active layer 702 aligns with an anti node 403 of the standing wave. Next, it is necessary that the sum of one half of the optical thickness of the first active layer 702 (73 nm), the optical thickness of the $Al_{0.25}Ga_{0.25}In_{0.5}P$ intermediate barrier layer 703, and one half of the optical thickness of the second active layer 704 (73 nm) be 340 nm.

Since the refractive index of the $Al_{0.25}Ga_{0.25}In_{0.5}P$ intermediate barrier layer 703 is 3.37, the thickness thereof should be 57.6 nm to make the optical thickness of the $Al_{0.25}Ga_{0.25}In_{0.5}P$ intermediate barrier layer 703 194 nm. The sum of 194 nm, 73 nm, and 73 nm is 340 nm. Thus, the center of the second active layer 704 aligns with another anti node 403 of the standing wave, as shown in FIG. 8.

Alternatively, a portion of the $Al_{0.25}Ga_{0.25}In_{0.5}P$ intermediate barrier layer 703 may be doped with magnesium or zinc to make the layer p-type so that the hole injection efficiency to the first active layer 702 can be enhanced.

At the p-side, it is necessary that the sum of one half of the optical thickness of the second active layer 704 (73 nm), and the optical thicknesses of the undoped $Al_{0.25}Ga_{0.25}In_{0.5}P$ barrier layer 306 and the p-type $Al_{0.5}In_{0.5}P$ layer 705 be the remainder, i.e., 1020 nm.

The barrier layer 306 is formed to have a thickness of 20 nm, and the p-type $Al_{0.5}In_{0.5}P$ layer 705 is formed to have a thickness of 273.2 nm. Since the refractive indices of the layers 306 and 705 are 3.37 and 3.22, respectively, the total optical thickness of these two layers is 947 nm. The sum of 947 nm and one half lf the optical thickness of the second active layer 704 is 1020 nm. The optical thickness of the n-type layer including the undoped barrier layer, the total optical thickness of the two active layers including the intermediate barrier layer, and the optical thickness of the p-type layer including the undoped barrier layer are 267 nm, 486 nm, and 947 nm, respectively. The total is 1700 nm, which corresponds to the optical thickness of a 2.5 wavelength resonator. In addition, the p-type AlGaInP layer has a thickness of 273.2 nm, which is in the range of 100 nm or more and 350 nm or less.

Multilayer film reflectors are formed at the both sides of the resonator. Both n-side and p-side multilayer film reflectors are arranged so that the interfaces between the resonator and the multilayer film reflectors align with the anti nodes of the standing wave.

To be specific, layers composed of a material having a low refractive index, i.e., an AlAs layer 801 at the n-side and an $Al_{0.9}Ga_{0.1}As$ layer 402 at the p-side, are in contact with the resonator. $Al_{0.5}Ga_{0.5}As$ layers 401 are disposed adjacent to the layers 801 and 402 at the n-side and the p-side. A required number of pairs (36 pairs at the p-side and 60 pairs at the n-side) is repeated at each side.

Then, as described in the example 1, an element may be formed or an array of elements may be formed.

Example 3

Example 3 of a red surface emitting laser element applied to a red surface emitting laser array will now be described. FIGS. 9A and 9B show a structure of an electrophotographic image forming device including a red surface emitting laser array of this example. FIG. 9A is a top view of the image forming device and FIG. 9B is a side view of the device.

The image forming device shown in FIG. 9 includes a photosensitive member 900, a charger 902, a developer 904, a transfer charger 906, a fixer 908, a rotating multifaceted mirror 910, a motor 912, a red surface emitting laser array 914, a reflector 916, a collimator lens 920, and an f-θ lens 922.

In FIGS. 9A and 9B, the motor 912 rotates the rotating multifaceted mirror 910. The rotating multifaceted mirror 910 of this example has six reflection planes.

The red surface emitting laser array 914 is the light source for recording. The red surface emitting laser array 914 is turned ON and OFF by a laser driver (not shown in the drawing) according to video signals. The modulated laser beams are applied to the rotating multifaceted mirror 910 from the red surface emitting laser array 914 through the collimator lens 920.

The rotating multifaceted mirror 910 rotates in the direction of the arrow. A laser beam output from the red surface emitting laser array 914 is reflected at the rotating multifaceted mirror 910 to form a deflected beam in which the angle of deflection is continuously varied due to the rotation of the multifaceted mirror 910. This reflected light is corrected for distortion and the like by the f-θ lens 922, reflected by the reflector 916, and irradiates the photosensitive member 900 while scanning the photosensitive member 900 in the main scanning direction. Reflection of the beam deflected by one facet of the rotating multifaceted mirror 910 forms an image corresponding to a plurality of lines corresponding to the red surface emitting laser array 914 in the main scanning direction. In this example, a 4-by-8 red surface emitting laser array is used, and an image corresponding to four lines is simultaneously formed.

The photosensitive member 900 is charged in advance with the charger 902. The photosensitive member 900 is sequentially exposed by scanning of the laser beam to form an electrostatic latent image. The photosensitive member 900 is rotated in the direction of the arrow. The electrostatic latent image is developed with the developer 904, and the resulting visible image is transferred to a transfer paper (not shown in the drawing) with the transfer charger 906. The transfer paper onto which the visible image has been transferred is fed to the fixer 908 to fix the image, and then discharged outside the system.

Although a 4-by-8 red surface emitting laser array is used in the example, other types of arrays may be used. For example, m×n red surface emitting laser array (m, n: natural number) may be used.

As described above, an image forming device achieving high-speed, high-precision printing can be formed by using the red surface emitting laser array in an electrophotographic image-forming device.

In some cases, such as in the case where the element is applied to the light source of the electrophotographic device, a laser operation is required up to 60° C. while achieving a single transverse mode. In general, in order to achieve the single transverse mode, the emission region must be narrowed (4 μm or less in diameter). Even when the amount of injection current is the same, the actual current density increases, and the leakage current also increases.

According to this embodiment, a novel red surface emitting laser element with improved temperature characteristics is provided.

Figure 11:
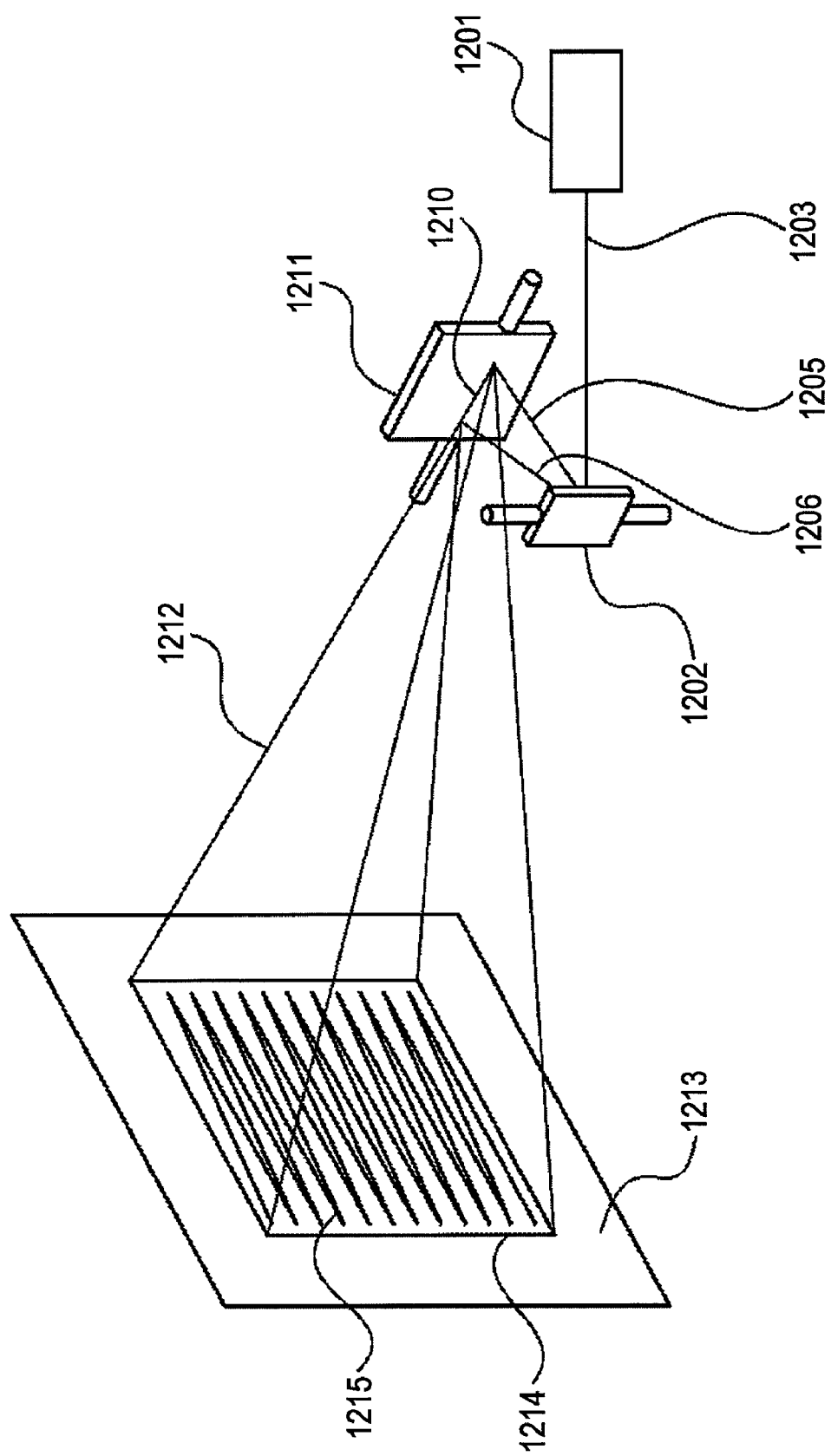
FIG. 11 is a schematic diagram of an image display apparatus.

An example of a laser display incorporating a laser element 1201 of this example is shown in FIG. 11. In FIG. 11, the laser display includes a first deflecting unit 1202 and a second deflecting unit 1211. The scanning trajectory on the second deflecting unit 1211 formed by the first deflecting unit 1202 is represented by reference numeral 1210. Reference numeral 1212 denotes light deflected by the second deflecting unit 1211, 1213 denotes a particular plane, 1214 denotes a range in the plane 1213 scanned by the deflected light, and 1215 schematically shows the trajectory of the scanning line on the plane 1213. In addition, reference numeral 1203 indicates the light direction of the laser element 1201. Reference numeral 1205 and 1206 indicate the deflected light directions.

The first deflecting unit 1202 and the second deflecting unit 1210 respectively deflect light in the horizontal direction and vertical direction. As a result, the region scanned by the deflected light becomes two dimensional.

Example 4

Example 4 will now be described. In Example 4, a periodic gain structure including two multi quantum well structures is employed. This structure increases the optical confinement ratio and mode gain, and high emission output can be easily obtained.

In addition to the periodic gain structure described above, a 2 wavelength resonator is used as shown in FIG. 10 to adjust the thickness of the p-type AlGaInP layer to 100 or more and 350 nm or less.

The layer structure of the resonator will now be described with reference to FIG. 10.

Since the resonant wavelength is 680 nm and the cavity length is 2 wavelength, the optical thickness is 1360 nm. All layers in the resonator are composed of AlGaInP, but AlGaInP materials with different compositional ratios are used for the active layer, barrier layer, and spacer layer. Thus, the thickness of each layer must be determined according to the refractive index so that the cavity length is 2 wavelength. Moreover, in order to maximize the interaction between light and carriers, the active layers 702 and 704 must be aligned with the anti nodes of the inner light intensity standing wave. In particular, the active layers are disposed at a position ¼ of 1360 nm and a position ½ of 1360 nm from one end, respectively, and the n-type layer is disposed in a smaller region (the left-hand side in FIG. 10), and the p-type layer is disposed in a larger region (the right-hand side in FIG. 10).

The actual examples will be described in detail below while considering the above-described conditions.

Each of the first and second active layers 702 and 704 includes four 6 nm GaInP quantum wells and three 6 nm $Al_{0.25}Ga_{0.25}In_{0.5}P$ barrier layers and has an actual thickness of 42 nm.

Since the refractive indices of the GaInP layer and the $Al_{0.25}Ga_{0.25}In_{0.5}P$ layer at a wavelength of 680 nm are 3.56 and 3.37, respectively, the optical thickness of each active layer is 146 nm. It is necessary that the sum of one half the optical thickness of the active layer region (73 nm), and optical thicknesses of the undoped $Al_{0.25}Ga_{0.25}In_{0.5}P$ barrier layer 304 and the n-type $Al_{0.35}Ga_{0.15}In_{0.5}P$ layer 303 be 340 nm.

The undoped $Al_{0.25}Ga_{0.25}In_{0.5}P$ barrier layer 304 is formed to have a thickness of 20 nm, and the n-type $Al_{0.35}Ga_{0.15}In_{0.5}P$ layer 303 is formed to have a thickness of 60.5 nm. Since the refractive indices of the layers 304 and 303 are 3.37 and 3.30, respectively, the total optical thickness of these two layers is 267 nm. The sum of 267 nm and one half of the optical thickness of the first active layer 702 (73 nm) is 340 nm. In other words, as shown in FIG. 10, the center of the first active layer 702 aligns with the anti node 403 of the standing wave. Next, it is necessary that the sum of one half of the optical thickness of the first active layer 702 (73 nm), the optical thickness of the $Al_{0.25}Ga_{0.25}In_{0.5}P$ intermediate barrier layer 703, and one half of the optical thickness of the second active layer 704 (73 nm) be 340 nm. Since the refractive index of the $Al_{0.25}Ga_{0.25}In_{0.5}P$ intermediate barrier layer 703 is 3.37, the thickness of the layer 703 should be 57.6 nm so that the optical thickness of the intermediate barrier layer 703 is 194 nm. The aforementioned total will then be 340 nm. Thus, the center of the second active layer 704 also aligns with the anti node 403 of the standing wave, as shown in FIG. 10. Alternatively, a portion of the AlGaInP intermediate barrier layer 703 may be doped with magnesium or zinc to make the layer p-type so as to enhance the hole injection efficiency to the first active layer 702.

At the p-side it is necessary that the sum of one half of the optical thickness of the second active layer 704 (73 nm) and the optical thicknesses of the undoped $Al_{0.25}Ga_{0.25}In_{0.5}P$ barrier layer 306 and the p-type $Al_{0.5}In_{0.5}P$ layer 705 be the remainder, i.e., 680 nm. When the barrier layer 306 has a thickness of 20 nm and the p-type $Al_{0.5}In_{0.5}P$ layer 705 has a thickness of 167.6 nm, the total optical thickness of the two layers is 607 nm since the refractive indices of the layers 306 and 705 are 3.37 and 3.22, respectively. The sum of 607 nm and 73 nm, which is one half of the optical thickness of the second active layer 704, is 680 nm. The optical thickness of the n-type layer including the undoped barrier layer, the total optical thickness of the two active layers including the intermediate barrier layer, and the optical thickness of the p-type layer including the undoped barrier layer are 267 nm, 486 nm, and 607 nm, respectively. The sum is 1360 nm, which corresponds to the optical thickness of a 2 wavelength resonator. The thickness of the p-type AlGaInP layer is 167.6 nm, which is in the range of 100 nm or more and 350 nm or less. Multilayer film reflectors are formed at the both sides of the resonator. Both n-side and p-side multilayer film reflectors are arranged so that the interfaces between the resonator and the multilayer film reflectors align with the anti nodes of the standing wave. To be specific, layers composed of a material having a low refractive index, i.e., an AlAs layer 801 at the n-side and an $Al_{0.9}Ga_{0.1}As$ layer 402 at the p-side, are in contact with the resonator. $Al_{0.5}Ga_{0.5}As$ layers 401 are disposed adjacent to the layers 801 and 402 at the n-side and the p-side. A required number of pairs (36 pairs at the p-side and 60 pairs at the n-side) is repeated at each side.

Example 5

Figure 12:
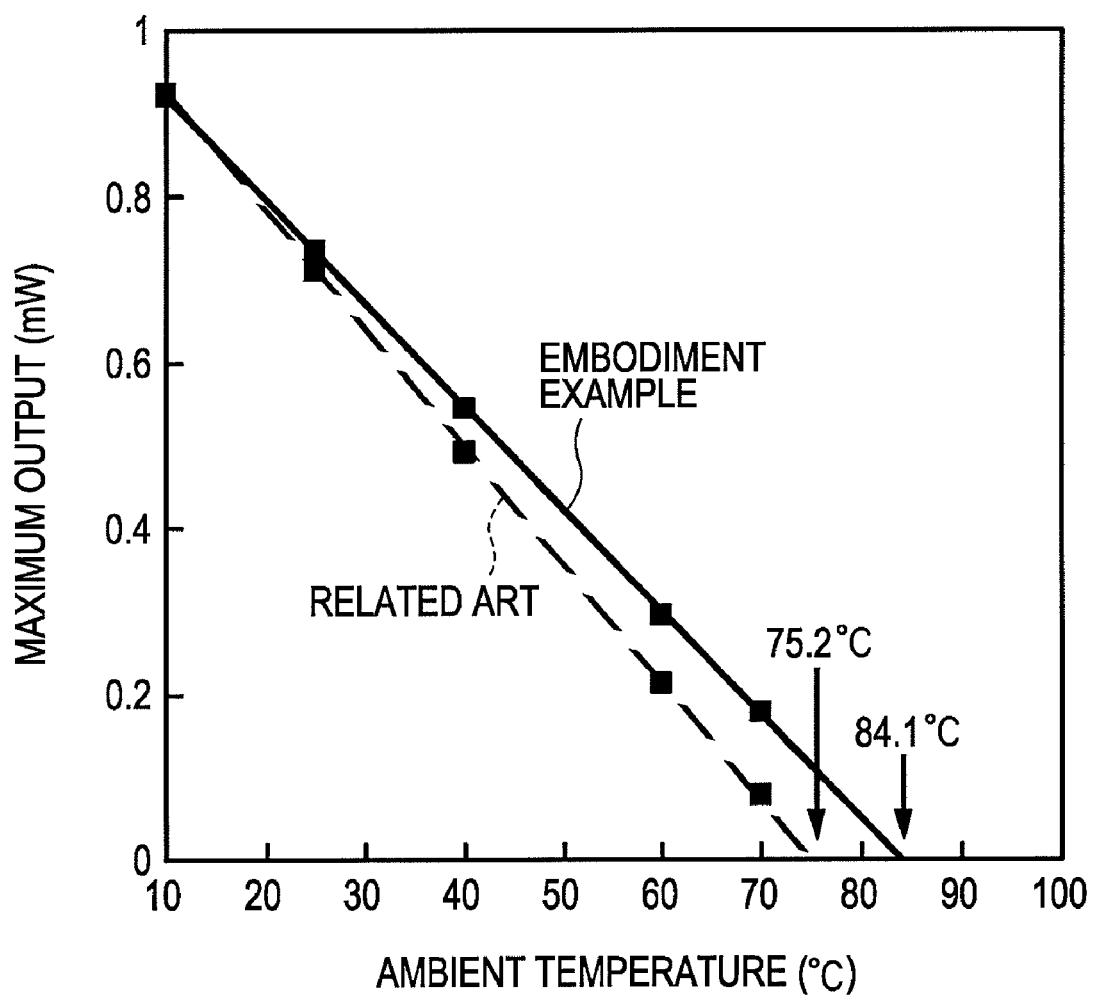
FIG. 12 is a graph showing temperature characteristics of an element of Example 5.

FIG. 12 is a graph showing the relationship (solid line) between the maximum output of a red surface emitting laser having a multilayer structure described in this embodiment and the ambient temperature. The red surface emitting laser has a structure shown in FIG. 10 described with reference to FIG. 10. The p-type semiconductor spacer layer 705 is a p-type $Al_{0.5}In_{0.5}P$ layer (thickness: 167.6 nm). Note that the layer 801 in FIG. 10 is composed of $Al_{0.9}Ga_{0.1}As$ instead of AlAs. In FIG. 12, the dotted line shows the characteristic of an element in which the p-type semiconductor spacer layer is composed of $Al_{0.35}Ga_{0.15}In_{0.5}P$ and has a thickness of 60.5 nm while the rest of the layer structure remains the same as that of the element indicated by the solid line in the graph.

As described above, the amount of leakage current tends to increase with the ambient temperature, and the optical output tends to decrease with increasing ambient temperature. Whereas emission from an element of related art (dotted line in FIG. 12) stops at an ambient temperature of 75.2° C., the laser element of this embodiment achieve emission up to 84.1° C. When the maximum outputs of two elements at 60° C. are compared, the maximum output of the element of this embodiment is larger than that of the related art by about 40%. In other words, with the element of this embodiment, the leakage current is reduced and a red surface emitting laser capable of high-temperature operation can be achieved.

It should be noted here that an AlAs layer having a low thermal resistance can be used as a low refractive index layer constituting the lower DBR disposed at the substrate side. In such a case, the heat generated inside the laser element can escape easily, and temperature increase inside the element can be suppressed.

Table 1 shows examples of p-type spacer layers with various thicknesses. In the table, an $Al_{0.5}In_{0.5}P$ layer is used as the p-type spacer layer, an $Al_{0.35}Ga_{0.15}In_{0.5}P$ layer is used as the n-type spacer layer, and an $Al_{0.25}Ga_{0.25}In_{0.5}P$ layer is used as the undoped barrier layers at each of the p-side and n-side. When a quadruple $Ga_{0.5}In_{0.5}P/Al_{0.25}Ga_{0.25}In_{0.5}P$ quantum well is used as the active layer, the thickness is 42 nm. When a periodic gain structure is used, the thickness including the intermediate undoped barrier layer is 141.6 nm for a double periodic gain structure and the thickness is 241.2 nm including two intermediate undoped barrier layers for a triple periodic gain structure.

In Examples 1, 2, and 4, the thickness of the p-type spacer layer is 167.6 nm or 273.2 nm. However, as shown in Table 1, the thickness of the p-type spacer layer can be adjusted to a desired value (100 nm or more and 350 nm or less) by adequately adjusting the cavity length and the thicknesses of the active layer, the undoped barrier layer, and the n-type spacer layer.

When the cavity length is required to be an integral multiple of one half of the designed wavelength and the center of the active layer is required to align with an anti-node of the standing wave, the thickness of the p-type spacer does not take a continuous value. As shown in Table 1, it is possible to adjust the thickness of the p-type spacer layer to some extent within the range defined by the present invention by adjusting the thickness of the undoped barrier layer.

TABLE 1

| | Active layer thickness (nm) | P-type spacer layer thickness (nm) | P-side undoped barrier layer thickness (nm) | N-type spacer layer thickness (nm) | N-side undoped barrier layer thickness (nm) | Cavity length (wavelength) | Ref. |
|---|---|---|---|---|---|---|---|
| 1 | 42.0 | 100.0 | 84.6 | 60.5 | 20 | 1.5 | |
| 2 | 42.0 | 150.0 | 36.8 | 43.3 | 36.8 | 1.5 | |
| 3 | 42.0 | 167.6 | 20 | 60.5 | 20 | 1.5 | FIG. 4 |
| 4 | 42.0 | 273.2 | 20 | 60.5 | 20 | 2 | |
| 5 | 141.6 | 167.6 | 20 | 60.5 | 20 | 2 | FIG. 10 |
| 6 | 42.0 | 300.0 | 95.2 | 60.5 | 20 | 2.5 | |
| 7 | 42.0 | 350.0 | 47.5 | 32.4 | 47.5 | 2.5 | |
| 8 | 141.6 | 273.2 | 20 | 60.5 | 20 | 2.5 | FIG. 8 |
| 9 | 42.0 | 237.2 | 20 | 163.5 | 20 | 2.5 | |
| 10 | 42.0 | 350.0 | 47.5 | 135.4 | 47.5 | 3 | |
| 11 | 141.6 | 350.0 | 47.5 | 60.5 | 20 | 3 | |
| 12 | 141.6 | 252.2 | 40 | 143.1 | 40 | 3 | |
| 13 | 141.6 | 252.2 | 40 | 246.1 | 40 | 3.5 | |
| 14 | 141.6 | 350.0 | 47.5 | 135.4 | 47.5 | 3.5 | |
| 15 | 141.6 | 350.0 | 47.5 | 238.4 | 47.5 | 4 | |
| 16 | 241.2 | 252.2 | 40 | 246.1 | 40 | 4 | |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-033788, filed in Feb. 14, 2007, and Japanese Patent Application No. 2008-024485, filed in Feb. 4, 2008, which are hereby incorporated by reference herein in their entirety.

What is claimed is:

1. A red surface emitting laser element comprising:
    a substrate;
    a first reflector including an n-type semiconductor multilayer film;
    a second reflector including a p-type semiconductor multilayer film, the p-type semiconductor multilayer film comprising a low refractive index layer composed of AlAs or AlGaAs and a high refractive index layer composed of AlGaAs, and the low refractive index layer and the high refractive index layer being stacked on each other, wherein the first reflector is provided between the substrate and the second reflector;
    an active layer between the first reflector and the second reflector;
    a p-type semiconductor spacer layer between the active layer and the second reflector, the p-type semiconductor spacer layer having a thickness of 100 nm or more and 350 nm or less and containing aluminum, indium, and phosphorus; and
    an n-type semiconductor spacer layer between the active layer and the first reflector,
    wherein the active layer, the p-type semiconductor spacer layer, and the n-type semiconductor spacer layer constitute a resonator, and the resonator has an asymmetrical structure in which the active layer is not located at the center of the resonator in a cavity length direction, and
    wherein a thickness of the p-type semiconductor spacer layer is larger than a thickness of the n-type semiconductor spacer layer.

2. The red surface emitting laser element according to claim 1, wherein the thickness of the p-type semiconductor spacer layer is 150 nm or more and 300 nm or less.

3. The red surface emitting laser element according to claim 1, wherein the p-type semiconductor spacer layer contains $Al_xGa_yIn_{1-x-y}P$ ($0.45 \leq x+y \leq 0.55$, $0.25 \leq x \leq 0.55$, $0 \leq y \leq 0.30$).

4. The red surface emitting laser element according to claim 1, wherein the p-type semiconductor spacer layer contains $Al_xGa_yIn_{1-x-y}P$ ($0.50 \leq x+y \leq 0.52$, $0.35 \leq x \leq 0.52$, $0 \leq y \leq 0.17$).

5. The red surface emitting laser element according to claim 1, wherein the second reflector is composed of a semiconductor material having a lattice matching with GaAs.

6. The red surface emitting laser element according to claim 1, wherein the active layer is a quantum well active layer including a layer composed of GaInP and a layer composed of AlGaInP.

7. The red surface emitting laser element according to claim 1, further comprising another spacer layer between the p-type semiconductor spacer layer and the active layer.

8. The red surface emitting laser element according to claim 1, wherein a cavity length of a resonator including the active layer is 1.5 wavelengths or more and 4 wavelengths or less.

9. An image-forming device comprising:

the red surface emitting laser element according to claim 1; and a deflector for reflecting a laser beam output from the laser element to conduct scanning.

10. The image-forming device according to claim 9, further comprising:

a photosensitive member for forming an electrostatic latent image by a beam deflected by the deflector;

a charger;

a developer; and a fixer.

11. An image display apparatus comprising:

the red surface emitting laser element according to claim 1; and a deflector for reflecting a laser beam output from the laser element to conduct scanning.

12. The red surface emitting laser element according to claim 1, wherein the active layer comprises a plurality of active layers.

* * * * *